(12) United States Patent
Hiramoto et al.

(10) Patent No.: US 6,887,717 B2
(45) Date of Patent: *May 3, 2005

(54) MAGNETORESISTIVE DEVICE AND METHOD FOR PRODUCING THE SAME, AND MAGNETIC COMPONENT

(75) Inventors: Masayoshi Hiramoto, Ikoma (JP); Nozomu Matsukawa, Yamatokoriyama (JP); Hiroshi Sakakima, Kyotanabe (JP); Hideaki Adachi, Hirakata (JP); Akihiro Odagawa, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 104 days.

This patent is subject to a terminal disclaimer.

(21) Appl. No.: 10/223,875

(22) Filed: Aug. 19, 2002

(65) Prior Publication Data

US 2003/0017723 A1 Jan. 23, 2003

Related U.S. Application Data

(62) Division of application No. 09/744,513, filed as application No. PCT/JP00/03452 on May 29, 2000, now Pat. No. 6,528,326.

(30) Foreign Application Priority Data

May 28, 1999 (JP) .......................................... 11-149878
Oct. 6, 1999 (JP) .......................................... 11-285555

(51) Int. Cl.[7] .............................................. H01L 21/00
(52) U.S. Cl. .......................................... 438/3; 438/381
(58) Field of Search ...................... 438/381, 3; 257/421

(56) References Cited

U.S. PATENT DOCUMENTS 5,742,458 A * 4/1998 Koike et al. ........... 360/324.11
5,986,858 A    11/1999 Sato et al.
6,215,696 B1   4/2001 Tsuge
6,221,508 B1   4/2001 Kanbe et al.
6,333,842 B1 * 12/2001 Nobuyuki et al. ....... 360/324.2

(Continued)

FOREIGN PATENT DOCUMENTS

| JP | 11-54814    | 2/1999 |
| JP | 11-97766    | 4/1999 |
| JP | 11-134620   | 5/1999 |
| JP | 11-177161   | 7/1999 |
| KR | 1999-0036568 | 5/1999 |

OTHER PUBLICATIONS

International Search Report.
Miyazaki "Spin Tunneling Magnetoresistive Effect" 1996, Nihon Ouyou Jiki Gakkai–Shi, vol. 20, No. 5. pp 896–904.

(Continued)

*Primary Examiner*—Tuan H. Nguyen
(74) *Attorney, Agent, or Firm*—Merchant & Gould P.C.

(57) ABSTRACT

A magnetoresistive device including a high-resistivity layer (13), a first magnetic layer (12) and a second magnetic layer (14), the first magnetic layer (12) and the second magnetic layer (14) being arranged so as to sandwich the high-resistivity layer (13), wherein the high-resistivity layer (13) is a barrier for passing tunneling electrons between the first magnetic layer (12) and the second magnetic layer (14), and contains at least one element $L_{ONC}$ selected from oxygen, nitrogen and carbon; at least one layer A selected from the first magnetic layer (12) and the second magnetic layer (14) contains at least one metal element M selected from Fe, Ni and Co, and an element $R_{CP}$ different from the metal element M; and the element $R_{CP}$ combines with the element $L_{ONC}$ more easily in terms of energy than the metal element M. Accordingly, a novel magnetoresistive device having a low junction resistance and a high MR can be obtained.

2 Claims, 18 Drawing Sheets

U.S. PATENT DOCUMENTS 6,340,520 B1    1/2002   Koike et al.
6,341,053 B1    1/2002   Nakada et al.
6,528,326 B1 *  3/2003   Hiramoto et al. .............. 438/3

OTHER PUBLICATIONS

M. Julliere "Tunneling Between Ferromagnetic Films" 1975, Physics letters vol. 54A, No 3, pp 225–226.

Miyazaki et al. "Giant Magnetic Tunneling Effect in Fe/$AL_2O_3$/Fe Junction" 1995, Journal of Magnetism and Magnetic Materials No 139, pp 231–234.

Tsuge et al. "Fabrication of Magnetic Tunnel Junctions with In Situ Naturally–Oxidized Tunnel Barrier" 1998, Document of the $103^{rd}$ Workshop by the society of Applied Magnetics of Japan, p 119–124.

Moodera et al. "Large Magnetoresistance at Room Temperature in Ferromagnetic Thin Film Tunnel Junctions" 1995, Physical Review Letters, vol. 74, No. 16, pp 3273–3276.

* cited by examiner (a)

(b)

(a)

(b)

(a)

(b)

(c)

(d)

(e)

(a)

(b)

(c)

(a)

(b)

MAGNETORESISTIVE DEVICE AND METHOD FOR PRODUCING THE SAME, AND MAGNETIC COMPONENT

This application is a divisional of application Ser. No. 09/744,513, filed January 24, 2001, now U.S. Pat. No. 6,528,326 which application(s) are incorporated herein by reference which is a 371 of PCT/JP00/03452 filed May 29, 2000.

TECHNICAL FIELD

The present invention relates to a magnetoresistive device and a method for producing the same, and a magnetic component.

BACKGROUND ART

A TMR (tunnel magnetic resistance) device is a device in which a very thin insulating layer is inserted between two ferromagnetic layers. A TMR device uses the phenomenon that the tunneling current flowing through the insulating layer is changed by the relative angle of magnetization of each metal element M.

It has been expected in theory that when using a ferromagnetic metal element M having a high spin polarizability such as Fe or FeCO for the ferromagnetic layers, a high rate of change in magnetic resistance of at least 35% is obtained (M. Jullier, Phs. Lett. 54A (1975) 225). However, a high MR (magneto resistance) has not been possible to realize.

Recently, Miyazaki et al. reported that they produced an insulating layer of alumina by natural oxidation in the air, and obtained a high rate of change in MR (T. Miyazaki and N. Tezuka, J. Magn. Magn. Mater. 139 (1995) L231). With this report, active development of TMR materials and TMR devices has started.

The recently reported methods for producing insulating layers showing a high MR are classified largely into two methods. One is a natural oxidation method in which an aluminum film formed on a ferromagnetic film is oxidized in the air or in pure oxygen (Tsuge et al., Document of the 103rd Workshop by the Society of Applied Magnetics of Japan, p. 119, (1998)). The other is a plasma oxidation method in which an aluminum film formed on a ferromagnetic film is oxidized in an oxygen plasma (J. S. Moodera et al. Phy. Rev. Lett., 74, 3273 (1995)).

To obtain a high MR, these TMR devices use a transition metal showing a high spin polarizability such as Fe or CoFe for the lower ferromagnetic layer on which the aluminum film is formed.

Because the current flowing in a TMR device is mainly a tunneling current through an insulating layer, the resistance of the device is substantially high. Thus, when a TMR device is used as a reproducing head or MRAM, S/N ratio decreases due to thermal noise, and threshold frequency of a readout circuit decreases during a fast response.

To lower the resistance of the device, reducing the film thickness of the alumina insulating layer could be considered. However, with a conventional process for oxidizing an aluminum film, the lower ferromagnetic film is likely to be oxidized beyond the aluminum film when the aluminum film is thin. As a result, when antiferromagnetic materials such as $Fe_2O_3$ and $CoO$ are formed at the interface with the aluminum oxide film by an excess oxidation reaction, for example, due to the interaction with these antiferromagnetic oxides, tunneling electrons lose information of magnetization direction with an external magnetic field.

On the other hand, when the aluminum film is not oxidized completely and a portion of the aluminum film remains, the spin memory of the tunneling electrons passing through the remaining aluminum film is lost, and MR is reduced.

Furthermore, in conventional TMR devices, when a large bias is applied, the rate of change in MR is decreased greatly due to generation of magnon, etc.

Furthermore, conventional MR devices do not have a sufficient thermal stability, and for example, when using them as MRAM, heat deterioration such as decreased MR property is caused during post-annealing of CMOS (at about 250 to 400° C.) or heating in the production of MR heads (at about 250° C.), or during its use.

DISCLOSURE OF THE INVENTION

In view of the above-mentioned problems, it is an object of the present invention to provide a new magnetoresistive device having a low junction resistance and a high MR and a method for producing the same, and a magnetic component.

To achieve the above object, the present invention provides a magnetoresistive device including a high-resistivity layer, a first magnetic layer and a second magnetic layer, the first magnetic layer and the second magnetic layer being arranged so as to sandwich the high-resistivity layer, wherein the high-resistivity layer is a barrier for passing tunneling electrons between the first magnetic layer and the second magnetic layer, and contains at least one element $L_{ONC}$ selected from oxygen, nitrogen and carbon; at least one layer A selected from the first magnetic layer and the second magnetic layer contains at least one metal element M selected from Fe, Ni and Co, and an element $R_{CP}$ different from the metal element M; and the element $R_{CP}$ combines with the element $L_{ONC}$ more easily in terms of energy than the metal element M. In the magnetoresistive device of the present invention, the element $R_{CP}$ contained in the layer A combines selectively with the element $L_{ONC}$ diffusing from the high-resistivity layer to form a compound. Thus, in the magnetoresistive device of the present invention, oxidation, nitriding or carbonization of the metal element M can be inhibited, thereby preventing generation of a localized spin resulting in spin inversion. Furthermore, when the element $R_{CP}$ in the layer A combines with the element $L_{ONC}$ to form a compound, the compound itself functions as a part of the high-resistivity layer. In addition, because the diffusion velocity of oxygen ions or nitrogen ions in the compound of the element $R_{CP}$ and the element $L_{ONC}$ is substantially lower than in the magnetic films, the compound of the element $R_{CP}$ and the element $L_{ONC}$ acts as a layer to inhibit diffusion of excess oxygen or nitrogen. Therefore, in the magnetoresistive device of the present invention, formation of a high-resistivity layer having a larger thickness than necessary, resulting in an increase in the resistance of the device, is inhibited. Thus, according to the magnetoresistive device of the present invention, a device having a low junction resistance and a high MR is obtained.

In the magnetoresistive device of the present invention, it is preferable that the layer A contains the element $R_{CP}$ so that a concentration of the element $R_{CP}$ is high on the side of the high-resistivity layer. When the element $R_{CP}$ is in a solid solution state with a metal composed of the metal element M, its spin polarizability is generally lower than that of the single metal composed of the metal element M. However, by making the concentration of the element $R_{CP}$ high on the side of the high-resistivity layer in the layer A, the element $R_{CP}$ forms a compound, and the element $R_{CP}$ and the metal element M are separated in phase. As a result, high spin polarizability is obtained in the vicinity of the high-resistivity layer, which has the greatest influence on the rate of change in magnetoresistance. The spin polarizability can be increased by decreasing the concentration of the element $R_{CP}$ as it is farther from the high-resistivity layer. The layer A may have a two-layered structure such as an element $R_{CP}$-containing Fe layer/Fe layer from the side of the high-resistivity layer. The layer A also may have a structure such as an element $R_{CP}$-containing FeCo layer/FeCo layer from the side of the high-resistivity layer.

In the magnetoresistive device of the present invention, it is preferable that the element $R_{CP}$ is at least one element selected from Si, Ge, Al, Ga, Cr, V, Nb, Ta, Ti, Zr, Hf, Mg and Ca. These elements have a larger free energy in negative for forming oxides than the metal element M, and selectively capture oxygen ions or nitrogen ions diffusing from the high-resistivity layer. Among these elements, Si, Al, Cr and Ti have particularly large diffusion constants in metal elements. Thus, these four elements diffuse toward the side of the high-resistivity layer so that their concentrations are high on the side of the high-resistivity layer, using as a driving force the chemical potential gradient of the oxygen or nitrogen ions generated when forming the high-resistivity layer. Therefore, a desirable concentration gradient of the element $R_{CP}$ can be formed easily by using these four elements. This self-diffusion of elements tends to appear more remarkably when the high-resistivity layer is formed at a higher reaction temperature.

In the magnetoresistive device of the present invention, it is preferable that the layer A consists of Fe, Si and Al. Accordingly, a lower resistance of the device can be obtained. Furthermore, the rate of change in the magnetoresistance is increased, and the soft magnetic property of the layer A is enhanced. Thus, a high MR is obtained at a low magnetic field.

In the magnetoresistive device of the present invention, it is preferable that the element $R_{CP}$ forms a compound with the element $L_{ONC}$ in the vicinity of the high-resistivity layer in the layer A. Accordingly, the spin polarizability in the vicinity of the high-resistivity layer is increased due to phase separation with the metal element M, so that a magnetoresistive device having a particularly high rate of change in magnetoresistance is obtained.

In the magnetoresistive device of the present invention, it is preferable that the second magnetic layer is formed after forming the high-resistivity layer, and a portion of the high-resistivity layer contacting the second magnetic layer contains an aluminum oxide as a main component. Oxygen and nitrogen ions have a lower diffusion constant in an aluminum oxide than in other oxides. Thus, according to the above structure, diffusion of these ions through the high-resistivity layer can be inhibited effectively when forming the high-resistivity layer. As a result, the probability that the element $R_{CP}$ captures oxygen and nitrogen ions diffusing through the high-resistivity layer increases, so that oxidation and nitriding of the metal element M resulting in spin inversion can be inhibited. Furthermore, according to the above structure, the thickness of the high-resistivity layer is controlled easily. Furthermore, in the above structure, it is preferable that a current is passed so that the first magnetic layer is positive and the second magnetic layer is negative. Accordingly, diffusion of oxygen ions is inhibited when a current is applied, so that the life of the device can be extended.

In the magnetoresistive device of the present invention, it is preferable that at least a portion of the high-resistivity layer is formed by forming a film containing the metal element M and the element $R_{CP}$, and then reacting the surface of the film with the element $L_{ONC}$. Accordingly, the element $R_{CP}$ in the first magnetic layer and the high-resistivity layer form a thermally stable relationship, so that the reliability of the device at a high temperature is increased. Furthermore, in this case, it is preferable that a current is passed so that the first magnetic layer is negative and the second magnetic layer is positive. Accordingly, diffusion of oxygen ions is inhibited when a current is applied, so that the life of the device can be extended.

Furthermore, the present invention provides a method for producing a magnetoresistive device, including:

(a) forming a first magnetic layer located on a substrate, and a high-resistivity layer located on the first magnetic layer and containing at least one element $L_{ONC}$ selected from oxygen, nitrogen and carbon; and (b) forming a second magnetic layer on the high-resistivity layer; wherein the first magnetic layer contains at least one metal element M selected from Fe, Ni and Co, and an element $R_{CP}$ different from the metal element M; and the element $R_{CP}$ combines with the element $L_{ONC}$ more easily in terms of energy than the metal element M. According to the method of the present invention, a magnetoresistive device of the present invention can be produced.

In the method of the present invention, it is preferable that the step (a) includes:

(a-1) forming a magnetic layer containing the metal element M on the substrate, and (a-2) forming a layer B containing the element $R_{CP}$ on the magnetic layer, and then reacting a portion of the layer B on the side of its surface with the element $L_{ONC}$ thereby to form the high-resistivity layer, and further includes:

after the step (a-2) and before or after the step (b), allowing unreacted parts of the element $R_{CP}$ in the layer B and the metal element M in the magnetic layer to diffuse mutually by heating the substrate at a temperature of at least 50° C. but not higher than 350° C., thereby to form the first magnetic layer in which the concentration of the element $R_{CP}$ gradually increases to the side of the high-resistivity layer. Accordingly, unreacted parts of the element $R_{CP}$ are allowed to diffuse into the first magnetic layer, so that deletion of spin memory due to unreacted parts of the element $R_{CP}$ can be prevented.

In the method of the present invention, it is preferable that the step (a) includes:

(a-1) forming the first magnetic layer on the substrate; and (a-2) forming a layer C having a thickness of 0.1 nm to 2 nm and containing the element $R_{CP}$ on the first magnetic layer, and then reacting the layer C with the element $L_{ONC}$ thereby to form the high-resistivity layer. Accordingly, when forming the high-resistivity layer, the element $R_{CP}$ in the first magnetic layer captures the element $L_{ONC}$ diffusing from the high-resistivity layer to form a compound. Thus, a magnetoresistive device having a low junction resistance and a high MR is obtained.

In the method of the present invention, it is preferable that in the step (a-2), the element $R_{CP}$ in the layer C is allowed to diffuse into the first magnetic layer so that the concentration of the element $R_{CP}$ gradually increases to the side of the high-resistivity layer in the first magnetic layer.

In the method of the present invention, it is preferable that the step (a) includes:

(a-1) forming the first magnetic layer on the substrate;

(a-2) depositing the element $R_{CP}$ on the first magnetic layer in a gas atmosphere containing the element $L_{ONC}$ thereby to form the high-resistivity layer. Accordingly, the magnetoresistive device of the present invention can be produced easily.

In the method of the present invention, it is preferable that in the step (a-2), the element $R_{CP}$ is allowed to diffuse into the first magnetic layer so that the concentration of the element $R_{CP}$ gradually increases to the side of the high-resistivity layer in the first magnetic layer.

In the method of the present invention, it is preferable that the step (a) includes:

(a-1) forming a magnetic layer containing the metal element M and the element $R_{CP}$ on the substrate; and (a-2) reacting the surface of the magnetic layer with the element $L_{ONC}$ thereby to form the first magnetic layer and the high-resistivity layer. According to this method, even when the surface of the magnetic layer is not flat, a high-resistivity layer having an approximately uniform thickness can be formed easily. Furthermore, in this method, it is preferable that in the step (a-2), the element $R_{CP}$ is allowed to diffuse into the first magnetic layer so that the concentration of the element $R_{CP}$ gradually increases to the side of the high-resistivity layer in the first magnetic layer. Furthermore, in this case, it is preferable that in the step (a-2), when reacting the surface of the magnetic layer with the element $L_{ONC}$, the surface of the magnetic layer is heated at a temperature of at least 50° C. but not higher than 800° C. By carrying out such a heating, the diffusion velocity of the element $R_{CP}$ can be increased, and the time for forming the high-resistivity layer can be shortened.

In the method of the present invention, it is preferable that in the step (a), the first magnetic layer is formed by evaporation or sputtering so that the concentration of the element $R_{CP}$ is high on the side of the high-resistivity layer in the first magnetic layer. Accordingly, the concentration distribution of the element $R_{CP}$ in the first magnetic layer can be controlled easily by controlling the deposition rate of the element $R_{CP}$.

Furthermore, the present invention provides a magnetic component including a magnetoresistive device, wherein the magnetoresistive device is obtained by heating the magnetoresistive device of the present invention at a temperature of at least 200° C. According to the magnetic component of the present invention, each magnetic component easily can obtain an arbitrary resistance meeting its use as well as a high MR. For example, a resistance of several ten-ohms to several mega-ohms times square micron for RA (resistance area) is required in MRAM. Also, a resistance of several tens of milli-ohm to several ohms times square micron is required in a magnetic head. Moreover, a high MR can be obtained even when its surface is relatively rough.

BEST MODE FOR CARRYING OUT THE INVENTION

In the following, embodiments of the present invention are described with reference to the drawings.

First Embodiment

In the first embodiment, an example of a magnetoresistive device of the present invention is described.

FIG. 1(a) shows a plan view of a magnetoresistive device 10 of a first embodiment. FIG. 1(b) shows a sectional view taken along the line X—X of FIG. 1(a).

Figure 1:
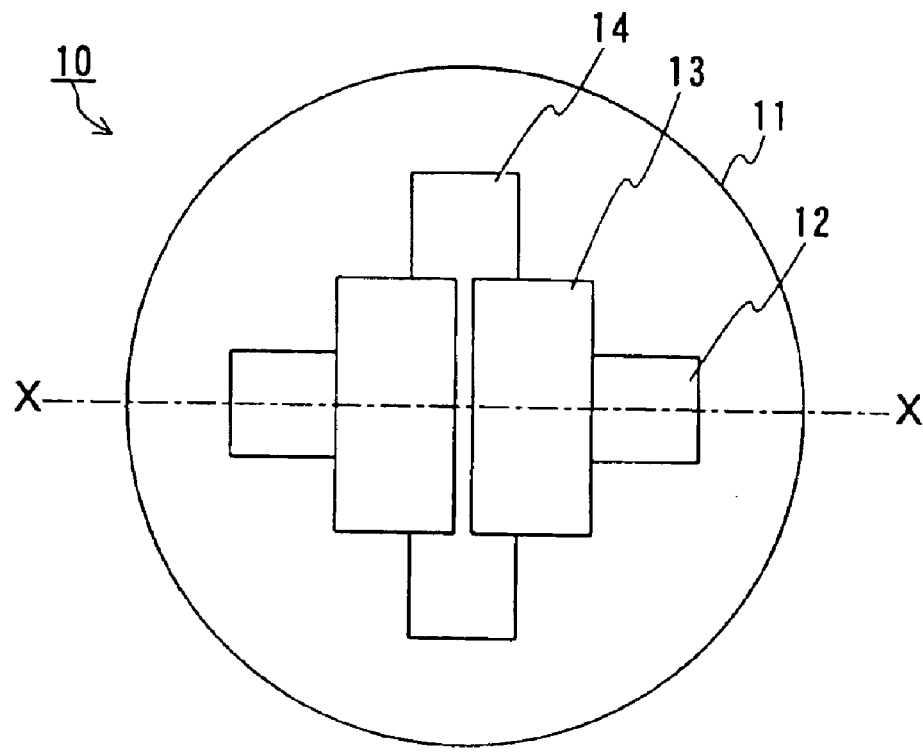
FIG. 1(a) is a plan view showing an example of a magnetoresistive device of the present invention.
FIG. 1(b) is a sectional view of the magnetoresistive device of FIG. 1(a).
Figure 1:
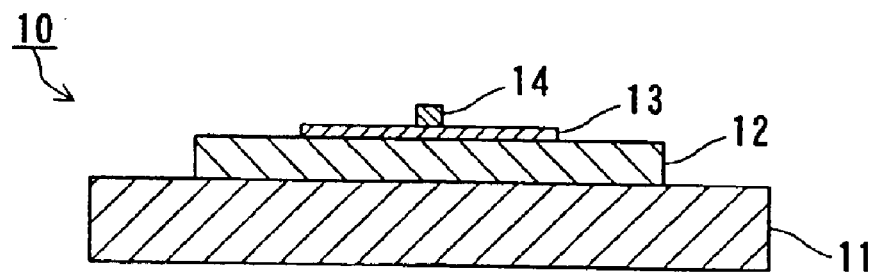

Referring to FIG. 1, a magnetoresistive device 10 includes a substrate 11, and a first magnetic layer 12, a high-resistivity layer 13 and a second magnetic layer 14 laminated one by one on the substrate 11. In other words, the magnetoresistive device 10 includes the high-resistivity layer 13, and the first magnetic layer 12 and the second magnetic layer 14 arranged so as to sandwich the high-resistivity layer 13.

Various substrates may be used for the substrate 11. Specifically, for example, a single crystal (magnesia, sapphire, STO, etc.), polycrystal (e.g. AlTIC substrate), amorphous (thermal oxide film of silicon), or conductive substrate (or an oxide of alumina or silicon formed on a base) may be employed. The substrate 11 is not limited to these examples, and other substrates also may be used as long as the first magnetic layer 12 and the second magnetic layer 14 are insulated. For example, when the substrate 11 is a conductor, an additional insulator may be formed between the first magnetic layer 12 and the second magnetic layer 14 in a place other than the tunnel junction.

It is preferable that the surface roughness of the substrate 11 is not more than 1 nm, particularly preferably not more than 0.5 nm. The substrate 11 may have a lower electrode layer or a lower magnetic layer on its surface as needed. The lower electrode layer herein referred to is an electrode for current and voltage to measure the magnetic resistance of the device, and a low-resistivity metal such as Pt, Au, Cu, Ru or Al may be used. In this case, it is particularly preferable that the lower electrode layer consists of a material containing at least 90 atomic % of Cu. Furthermore, before forming the high-resistivity layer (non-magnetic layer), to smooth the surface of the lower electrode layer, ions in a cluster form (e.g. cluster of an inert gas such as Ar) may be irradiated at a low angle with respect to the surface of the lower electrode layer. Furthermore, the first magnetic layer 12 may serve as the lower electrode layer.

Furthermore, a magnetic perovskite oxide, FeCo, Fe or the like having high spin polarizability may be used for the lower magnetic layer. Furthermore, when forming a spin valve magnetoresistive device, to make the first magnetic layer 12 or the second magnetic layer 14 to be a pinned layer, a conductive antiferromagnetic material consisting of a compound of at least one element selected from Pt, Ir, Cr, Pd, Ru and Re; and Mn (e.g. PtMn or IrMn) may be used. Also, Co-based alloy/Ru/Co-based alloy known as a synthetic structure may be used. In this case, the Ru layer has a thickness of 0.6 to 0.8 nm. The Co-based alloy contains at least 50% Co, and for example, Co, CoPt or CoPtCr may be used.

The first magnetic layer 12 and the second magnetic layer 14 essentially consist of magnetic metals and contain, for example, at least one metal element M selected from Fe, Ni and Co. Specifically, these layers contain, for example, Fe, Co, Ni, a FeCo alloy, a FeNi alloy or a CoFeNi alloy. Particularly, it is preferable that the amount of nickel in the FeNi alloy is from 30 to 80%, and the amount of Co in the FeCo alloy is at least 10%. Furthermore, in the first magnetic layer 12, it is preferable that the element $R_{CP}$ is included in these materials. Other than these materials, AMnSb (A is at least one selected from Ni, Cu and Pt) also may be used. Furthermore, materials such as LaSrMnO, $CrO_2$ and $Fe_3O_4$ that are oxides but exhibit high spin polarizability also may be used.

The high-resistivity layer (non-magnetic layer) 13 is a barrier for passing tunneling electrons between the first magnetic layer 12 and the second magnetic layer 14. The high-resistivity layer 13 may pass thermoelectrons in addition to tunneling electrons. In the magnetoresistive device 10, a current electrode and a voltage electrode are connected to each of the first magnetic layer 12 and the second magnetic layer 14, and a magnetic resistance is measured by a four-probe method. In the magnetoresistive device 10, a tunneling current flows through a portion where the first magnetic layer 12 and the second magnetic layer 14 cross each other. Hereinafter, the area of this crossing portion may be referred to as a cross-sectional area of the device.

The high-resistivity layer 13 contains an element $L_{ONC}$ that is at least one selected from oxygen, nitrogen and carbon as a constituent element. Specifically, a high-resistivity layer containing at least one selected from an oxide, a nitride and a carbide may be used as the high-resistivity layer 13. More specifically, for example, a layer consisting of a high-resistivity material having a high bandgap of at least 1 eV such as $Al_2O_3$, AlN, BN, $SiO_2$, $Si_3N_4$, SiC, (AlGa)N or (AlB)N may be used. Moreover, a layer consisting of a composite of these materials, or multiple layers of these materials may be used. The amounts of oxygen, nitrogen and carbon in these materials may deviate from their stoichiometric ratios by about 5%. Furthermore, the non-magnetic layer 13 may have a multi-layered structure in which a layer (not more than 1 nm in thickness) consisting of a non-magnetic metal material or a magnetic metal material is sandwiched between high-resistivity materials. Furthermore, a layer (not more than 0.5 nm in thickness) consisting of a non-magnetic metal may be inserted in the high-resistivity layer 13. The thickness of the high-resistivity layer 13 is, for example, from 0.2 nm to 5 nm, and particularly preferably from 0.5 nm to 2.5 nm.

In the magnetoresistive device 10, at least one layer A (preferably both layers) selected from the first magnetic layer 12 and the second magnetic layer 14 contains at least one metal element M selected from Fe, Ni and Co, and an element $R_{CP}$ different from the metal element M. Specifically, for example, a magnetic layer consisting of Fe, Si and Al or a layer containing the above-described magnetic materials and an element R may be used as the layer A. It is preferable that the layer A contains at least 0.1 atomic % of the element $R_{CP}$, particularly preferably at least 10 atomic % of the element $R_{CP}$. The element $R_{CP}$ in the layer A may be or may not be in a solid solution state with the metal element M. The element $R_{CP}$ in the layer A may form a compound by combining with the element $L_{ONC}$.

It is preferable that the layer A contains the element $R_{CP}$ so that the concentration of the element $R_{CP}$ is high on the side of the high-resistivity layer 13. In this case, the concentration of the element $R_{CP}$ may increase gradually to the side of the high-resistivity layer 13. Also, the layer A may have a two-layered structure consisting of a layer containing the element $R_{CP}$ and a layer not containing the element $R_{CP}$.

Furthermore, the second magnetic layer 14 may be formed after forming the high-resistivity layer 13, and at least a portion of the high-resistivity layer 13 contacting the second magnetic layer 14 may contain an aluminum oxide as a main component. In this case, it is preferable that a current is passed so that the first magnetic layer 12 is positive and the second magnetic layer 14 is negative. For example, the aluminum oxide may be $Al_2O_3$.

Furthermore, at least a portion of the high-resistivity layer 13 may be formed by forming a film containing the metal element M and the is element $R_{CP}$, and then reacting the surface of the film with the element $L_{ONC}$. In this case, it is preferable that a current is passed so that the first magnetic layer 12 is negative and the second magnetic layer 14 is positive.

The element $R_{CP}$ is characterized by that it combines with the element $L_{ONC}$ more easily in terms of energy than the metal element M. For example, (1) an element having a larger free energy in negative for forming an oxide by combining with one molecule of oxygen than the metal element M, (2) an element having a larger free energy in negative for forming a nitride by combining with one molecule of nitrogen than the metal element M, or (3) an element having a larger free energy in negative for forming a carbide by combining with one molecule of carbon than the metal element M may be used as the element $R_{CP}$. Specifically, at least one element selected from Si, Ge, Al, Ga, Cr, V, Nb, Ta, Ti, Zr, Hf, Mg and Ca may be used as the element $R_{CP}$.

In the magnetoresistive device 10, when forming the high-resistivity layer 13 or using the device, the element $R_{CP}$ in the layer A captures the element $L_{ONC}$ diffusing from the high-resistivity layer 13 to form a compound. As a result, in the magnetoresistive device 10, formation of an antiferromagnetic material such as $Fe_2O_3$ or CoO or a magnetic material having low spin polarizability such as $Fe_4N$ or FeC in the layer A can be prevented. Thus, according to the magnetoresistive device 10, the thickness of the high-resistivity layer can be made sufficiently small, so that a device having a low junction resistance and a high magnetic resistance can be obtained.

The magnetoresistive device shown in FIG. 1 is only one example, and the magnetoresistive device of the present invention may have other structures. As an example of a structure different from the magnetoresistive device 10, a plan view of the magnetoresistive device 10a is shown in FIG. 2(a). Furthermore, a sectional view taken along the line Y—Y of FIG. 2(a) is shown in FIG. 2(b).

Figure 2:
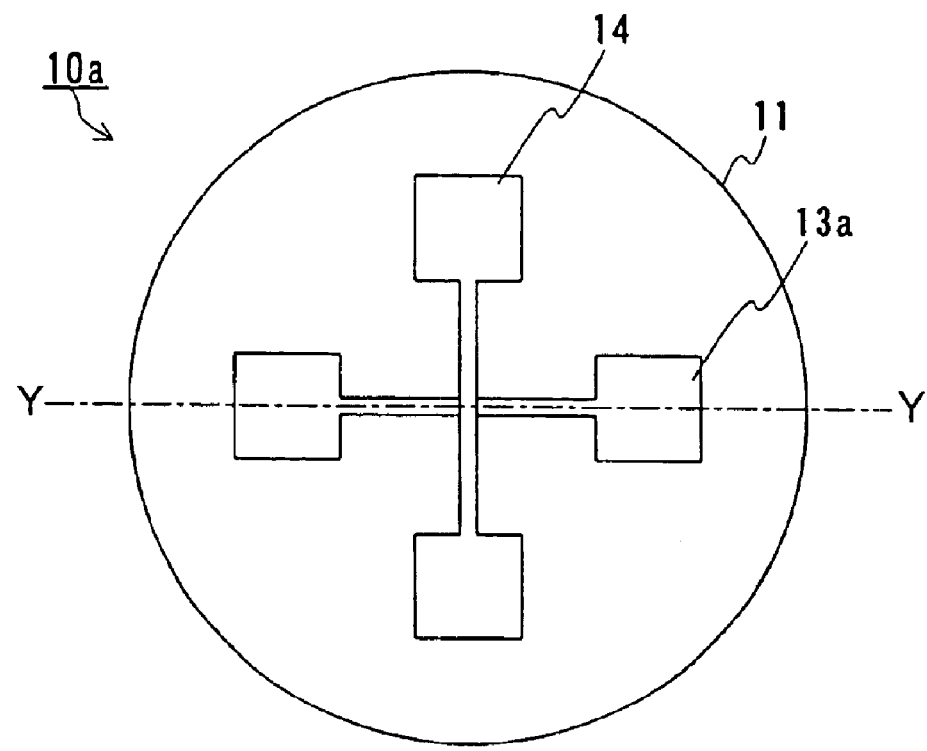
FIG. 2(a) is a plan view showing another example of a magnetoresistive device of the present invention.
FIG. 2(b) is a sectional view of the magnetoresistive device of FIG. 2(a).
Figure 2:
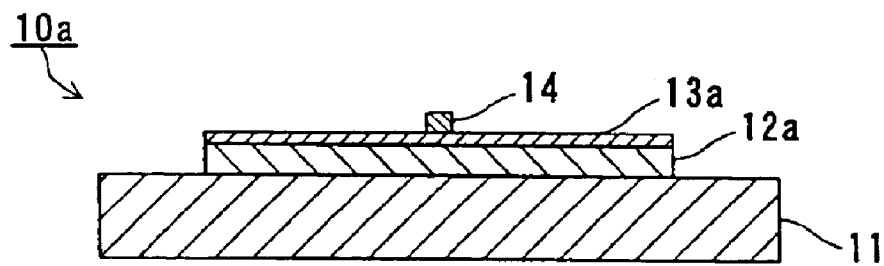

Referring to FIG. 2, the magnetoresistive device 10a includes a substrate 11, and a first magnetic layer 12a, a high-resistivity layer 13a and a second magnetic layer 14 laminated one by one on the substrate 11. The first magnetic layer 12a and the second magnetic layer 14 are arranged so as to sandwich the high-resistivity layer 13a.

Because the substrate 11 and the second magnetic layer 14 are the same as those in the magnetoresistive device 10, overlapped explanations thereof are omitted. The high-resistivity layer 13a is formed by reacting a portion of the first magnetic layer 12a with the element $L_{ONC}$, and has the same function as the high-resistivity layer 13. That is, in the magnetoresistive device 10a, at least a portion of the high-resistivity layer 13 is formed by forming a film containing the metal element M and the element $R_{CP}$, and then reacting the surface of the film with the element $L_{ONC}$.

In the magnetoresistive device 10a, it is preferable that a current is passed so that the first magnetic layer 12a is negative and the second magnetic layer 14 is positive.

According to the magnetoresistive device 10a, the same effect as that of the magnetoresistive device 10 is obtained.
Second Embodiment In the second embodiment, an example of the method for producing a magnetoresistive device according to the present invention is described. With respect to the same parts and elements as those described in the first embodiment, the same numerals are applied, and overlapped explanations thereof are omitted.

The method of the second embodiment includes:

(a) forming a first magnetic layer 12a located on a substrate 11, and a high-resistivity layer 13 located on the first magnetic layer 12a and containing at least one element $L_{ONC}$ selected from oxygen, nitrogen and carbon; and (b) forming a second magnetic layer 14 on the high-resistivity layer 13. The first magnetic layer 12a contains at least one metal element M selected from Fe, Ni and Co, and contains an element $R_{CP}$ different from the metal element M. As described in the first embodiment, the element $R_{CP}$ combines with the element $L_{ONC}$ more easily in terms of energy than the metal element M. It is preferable that the second magnetic layer 14 also contains the element $R_{CP}$.

In the following, the above-mentioned method is described further with more specific four methods. In FIGS. 3 to 6, only the portion where the first magnetic layer and the second magnetic layer cross each other is illustrated.
[First Method]

Figure 3:
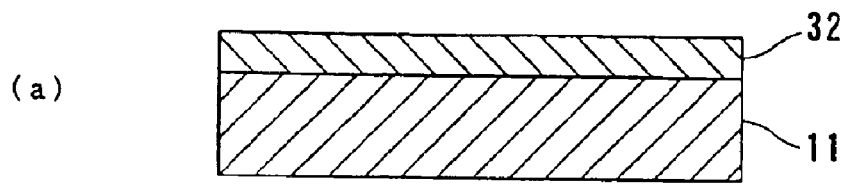
FIG. 3 is a process drawing showing an example of a method for producing a magnetoresistive device of the present invention.
Figure 3:
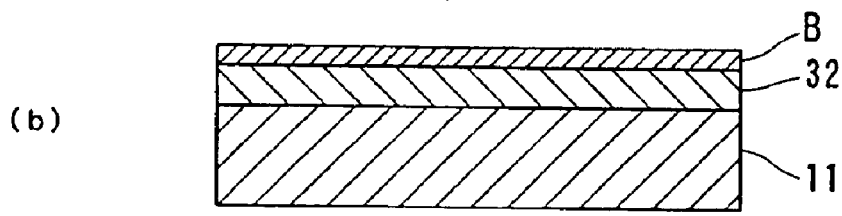
Figure 3:
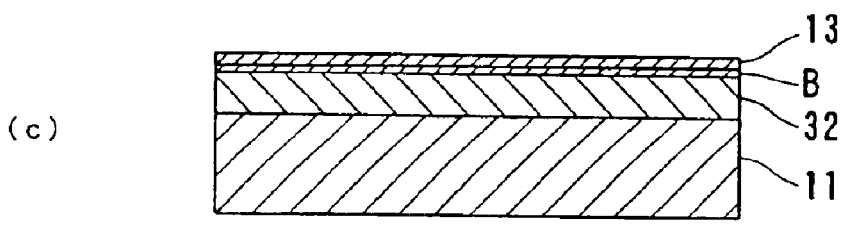
Figure 3:
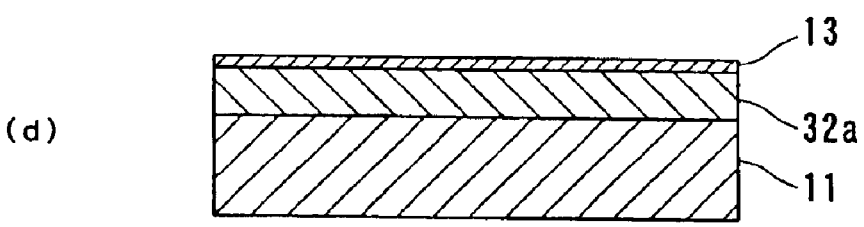
Figure 3:
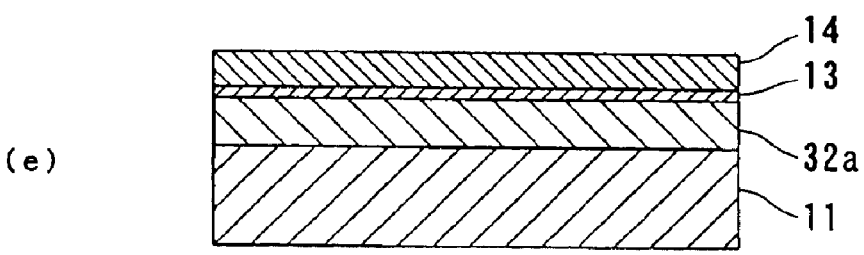

FIG. 3 shows an example of the production process of the first method. In the first method, first, as illustrated in FIG. 3(a), a magnetic layer 32 containing a metal element M is formed on a substrate 11. Specifically, a layer consisting of at least one selected from Fe, Ni and Co may be used as the magnetic layer 32. The magnetic layer 32 may be formed, for example, by a film-forming method such as evaporation using a metal mask, sputtering, MBE, laser ablation, high-frequency magnetron sputtering, direct current sputtering, facing target sputtering, or ion beam sputtering. Any of the following layers such as a magnetic layer or a high-resistivity layer also may be formed by the same film-forming method.

Then, as illustrated in FIG. 3(b), a layer B containing an element $R_{CP}$ is formed on the magnetic layer 32. The layer B can be formed, for example, using a metal mask having a square open hole.

Then, as illustrated in FIG. 3(c), a portion of the surface of the layer B is allowed to react with an element $L_{ONC}$ to form a high-resistivity layer 13. That is, the high-resistivity layer 13 is formed by oxidizing, nitriding, or carbonizing the element in the surface of the layer B. To react the surface of the layer B with the element $L_{ONC}$, for example, the layer B may be treated in a gas atmosphere containing the element $L_{ONC}$. Examples of the gas atmosphere containing the element $L_{ONC}$ include oxygen gas atmosphere, oxygen plasma atmosphere, nitrogen gas atmosphere, nitrogen plasma atmosphere, oxygen radical atmosphere, nitrogen radical atmosphere, ozone atmosphere, and the like. In the step of FIG. 3(c), the kind of a gas, partial pressure of a gas, plasma density, substrate temperature, and the like are controlled to carry out the treatment.

Then, as illustrated in FIG. 3(d), by heating the substrate on which the high-resistivity layer 13 is formed at a temperature of at least 50° C. but not higher than 350° C., unreacted parts of the element $R_{CP}$ not included in the high-resistivity layer 13 are allowed to diffuse mutually with the metal element M in the magnetic layer 32, thereby forming a first magnetic layer 32a containing the element $R_{CP}$ in which the concentration of the element $R_{CP}$ gradually increases to the side of the high-resistivity layer 13.

Then, as illustrated in FIG. 3(e), a second magnetic layer 14 is formed on the high-resistivity layer 13. The second magnetic layer 14 can be formed by the same method as the magnetic layer 32. Thus, the magnetoresistive device 10 described in the first embodiment can be produced.

In the first method, heating of the substrate (diffusion of the element $R_{CP}$) may be carried out after forming the second magnetic layer 14. The substrate also may be heated simultaneously with the step of forming the magnetic layer 32, so that the element $R_{CP}$ is allowed to diffuse into the magnetic layer 32 when forming the layer B. In this case, the outermost surface of the layer B is oxidized with residual oxygen or water in the vacuum device, etc. to form a high-resistivity layer. Thus, essentially, the step of forming a high-resistivity layer, the step of forming a layer consisting of unreacted $R_{CP}$, and the step of diffusing unreacted $R_{CP}$ proceed simultaneously. These steps are all included in the first method. Furthermore, fine processing for forming the device also may be carried out between these steps.
[Second Method]

In the second method, first, as illustrated in FIG. 4(a), a first magnetic layer 12a is formed on a substrate 11.

Then, as illustrated in FIG. 4(b), a layer C having a thickness of 0.1 nm to 2 nm and containing an element $R_{CP}$ is formed on the first magnetic layer 12a.

Then, as illustrated in FIG. 4(c), a high-resistivity layer 13 is formed by reacting the layer C with an element $L_{ONC}$. That is, the high-resistivity layer 13 is formed by oxidizing, nitriding, or carbonizing an element in the layer C. This is the same as the step of FIG. 3(c). However, the entire layer C is allowed to react with the element $L_{ONC}$ in the second method.

Then, as illustrated in FIG. 4(d), a second magnetic layer 14 is formed on the high-resistivity layer 13. Thus, the magnetoresistive device 10 described in the first embodiment can be produced.

It is preferable that the first magnetic layer 12a contains the element $R_{CP}$ so that the concentration of the element $R_{CP}$ gradually increases to the side of the high-resistivity layer 13. To form such a first magnetic layer 12a, the element $R_{CP}$ may be allowed to diffuse into the first magnetic layer 12a in the step of FIG. 4(b) or FIG. 4(c).

The first magnetic layer 12a also may be formed by evaporation or sputtering in which the deposition rates of respective elements are changed so that the concentration of the element $R_{CP}$ is high on the side of the high-resistivity layer 13 (this also applies to the following methods).

[Third Method]

In the third method, first, as illustrated in FIG. 5(a), a first magnetic layer 12a is formed on a substrate 11. This is the same as the step of FIG. 4(a).

Then, as illustrated in FIG. 5(b), a high-resistivity layer 13 is formed by depositing an element $R_{CP}$ on the first magnetic layer 12a in a gas atmosphere containing an element $L_{ONC}$. Examples of the gas atmosphere containing an element $L_{ONC}$ include oxygen gas atmosphere, oxygen plasma atmosphere, nitrogen gas atmosphere, nitrogen plasma atmosphere, oxygen radical atmosphere, nitrogen radical atmosphere, ozone atmosphere, and the like.

In the step of FIG. 5(b), the element $R_{CP}$ may be allowed to diffuse into the first magnetic layer 12a so that the concentration of the element $R_{CP}$ in the first magnetic layer 12a gradually increases to the side of the high-resistivity layer 13.

Then, as illustrated in FIG. 5(c), a second magnetic layer 14 is formed. This is the same as the step of FIG. 4(d). Thus, the magnetoresistive device 10 described in the first embodiment can be produced.

[Fourth Method]

In the fourth method, as illustrated in FIG. 6(a), a magnetic layer 62 containing a metal element M and an element $R_{CP}$ is formed on a substrate 11. The magnetic layer 62 can be formed by the same method as the first magnetic layer 12a.

Then, as illustrated in FIG. 6(b), by reacting the surface of the magnetic layer 62 with an element $L_{ONC}$, a first magnetic layer 12a and a high-resistivity layer 13 are formed. That is, in the step of FIG. 6(b), the high-resistivity layer 13 is formed by oxidizing, nitriding, or carbonizing the surface of the magnetic layer 62. To react the surface of the magnetic layer 62 with the element $L_{ONC}$, the magnetic layer 62 may be treated in a gas atmosphere containing the element $L_{ONC}$ in the same way as the step 4(c).

In the step of FIG. 6(b), it is preferable that the element $R_{CP}$ is allowed to diffuse into the first magnetic layer 12a so that the concentration of the element $R_{CP}$ in the first magnetic layer gradually increases to the side of the high-resistivity layer 13. In this case, it is preferable that when reacting the surface of the magnetic layer 62 with the element $L_{ONC}$, the surface of the magnetic layer 62 is heated at a temperature of at least 50° C. but not higher than 800° C. (preferably, 100° C. to 500° C.).

Then, as illustrated in FIG. 6(c), the second magnetic layer 14 is formed. This is the same as the step of FIG. 4(d). Thus, the magnetoresistive device 10a described in the first embodiment can be produced.

In the above-mentioned production method of the second embodiment, when forming the high-resistivity layer 13, the element $L_{ONC}$ diffusing from the high-resistivity layer 13 to the first magnetic layer 12a is captured by the element $R_{CP}$ in the first magnetic layer 12a. Thus, according to the above method, a magnetoresistive device having a low junction resistance and a high magnetic resistance can be produced.

The first magnetic layer 12a in which the concentration of the element $R_{CP}$ is high on the side of the high-resistivity layer 13 also may be formed by the following method. First, the first magnetic layer 12a and the high-resistivity layer 13 are formed. Then, under the environment in which the kind of gas, partial pressure of a gas, plasma density, substrate temperature and the like are controlled, the surface of the high-resistivity layer 13 is oxidized or nitirided, a gradient of chemical potential of oxygen ions or nitrogen ions is formed. This makes possible that the concentration of the element $R_{CP}$ gradually increases to the side of the high-resistivity layer 13 in the first magnetic layer 12a.

Although the method using a metal mask has been described in the above embodiment, general fine processing technology used for semiconductors or the like also may be employed. By using such fine processing technology, a magnetoresistive device used for magnetic reproducing heads or MRAM devices can be produced.

Third Embodiment

In the third embodiment, a magnetic component of the present invention is described.

The magnetic component of the present invention includes a magnetoresistive device. The magnetoresistive device is obtained by heating the magnetoresistive device of the present invention described in the first embodiment at a temperature of at least 200 C.

EXAMPLES

The present invention is described further below in detail with reference to examples.

Example 1

In Example 1, the magnetoresistive device 10 of the present invention was produced by the method shown in FIG. 3. In Example 1, the element $R_{CP}$ in the layer B was allowed to diffuse by heating after forming the second magnetic layer.

In Example, 1, four devices having cross-sectional areas of 20×20, 50×50, 100×100, and 200×200 ($\mu m \times \mu m$) were produced. The magnetic layers and the layer B were formed by RF magnetron sputtering using a metal mask. The degree of vacuum in the sputter equipment when forming a film was 6.65×10$^{-4}$ Pa (5×10$^{-6}$ Torr). The film-forming rate for each layer was about 10 nm/min.

In Example 1, as the substrate, a Si substrate on which a SiO$_2$ film (300 nm in thickness) was formed by thermal oxidation was used.

(1) A metal mask was placed on the Si substrate, and a film consisting of Fe (20 nm in thickness) was formed as the magnetic layer 32. Then, the sputter equipment was opened in the air, and the metal mask was exchanged.

(2) On the magnetic layer 32, a layer consisting of Si (0.5 nm in thickness) and a layer consisting of Al (1.0 nm in thickness) were formed one by one as the layer B.

(3) The substrate on which the layer B was formed was allowed to stand at a substrate temperature of 60° C. in a pure oxygen atmosphere for one hour, and the surface of the layer B was oxidized. Thus, the high-resistivity layer 13 was formed. Then, the sputter equipment was opened in the air, and the metal mask was exchanged.

(4) On the high-resistivity layer 13, a layer consisting of $Fe_{50}Co_{50}$ (20 nm in thickness) was formed as the second magnetic layer 14. At this time, MR was measured (applied magnetic field: ±79,600 A/m (±1000 Oe)).

(5) The substrate on which the second magnetic layer 14 was formed was heated at 250° C. in vacuum for 1 hour. The thus obtained magnetoresistive device was measured for MR (applied magnetic field: ±79,600 A/m (±1000 Oe)).

In the MR curve measured after the step (4), the MR increased rapidly at about 2,390 A/m (about 30 Oe), and the MR decreased rapidly at 23,900 A/m (300 Oe). This corresponds to the double hysteresis loops of the MH curve of this device measured by VSM (vibration sample magnetometer), and showed a typical tendency of differential coercive force. The value of 2,390 A/m (300 Oe) corresponds to the coercive force of Fe, and the value of 23,900 A/m (300 Oe) corresponds to the coercive force of the CoFe alloy. The MR ratio at ±79,600 A/m (±1000 Oe) and at zero magnetic field was about 13 to 16% in any cross-sectional area of the device. Furthermore, the device resistance normalized for the cross-sectional area of 1 $\mu$m×1 $\mu$m was about 1 M$\Omega$ irrespective of the cross-sectional area of the device.

In the MR curve measured after the step (5), the rise field and fall field of MR was decreased to 1,990 A/m (25 Oe) and 21,500 A/m (270 Oe), respectively. Furthermore, in any cross-sectional area of the device, the MR ratio was increased up to about 20 to 23%. Furthermore, after the step (5), the device resistance at zero magnetic field was decreased to 300 K$\Omega$.

The interface of the high-resistivity layer before and after the heating in the step (5) was observed by an Auger depth profile. The result showed that the interface between Fe and Si, which was sharp right after forming the films, was broad after the heating so that the concentration of Si was high on the side of the high-resistivity layer. Furthermore, when investigating the change in oxidation condition before and after the heating by XPS, only the peak of an aluminum oxide was observed both before and after heating. Furthermore, when investigating the change in the bonding condition before and after the heating by X-ray diffraction, it was found that the peak of Fe right after forming the films shifted to the side of the FeSi alloy after the heating.

These results show that at least Si remained at the interface between the first magnetic layer and the high-resistivity layer right after forming the films, and Si was allowed to diffuse mutually with Fe in the first magnetic layer 12 by the heating.

It is considered that the change in MR before and after the heating was caused by the deletion of spin memory due to unreacted Si before the heating and the increase in spin polarizability at the interface of the high-resistivity layer due to the heating.

Thus, in Example 1, a magnetoresistive device having a low device resistance and a high MR was obtained.

Example 2

Figure 4:
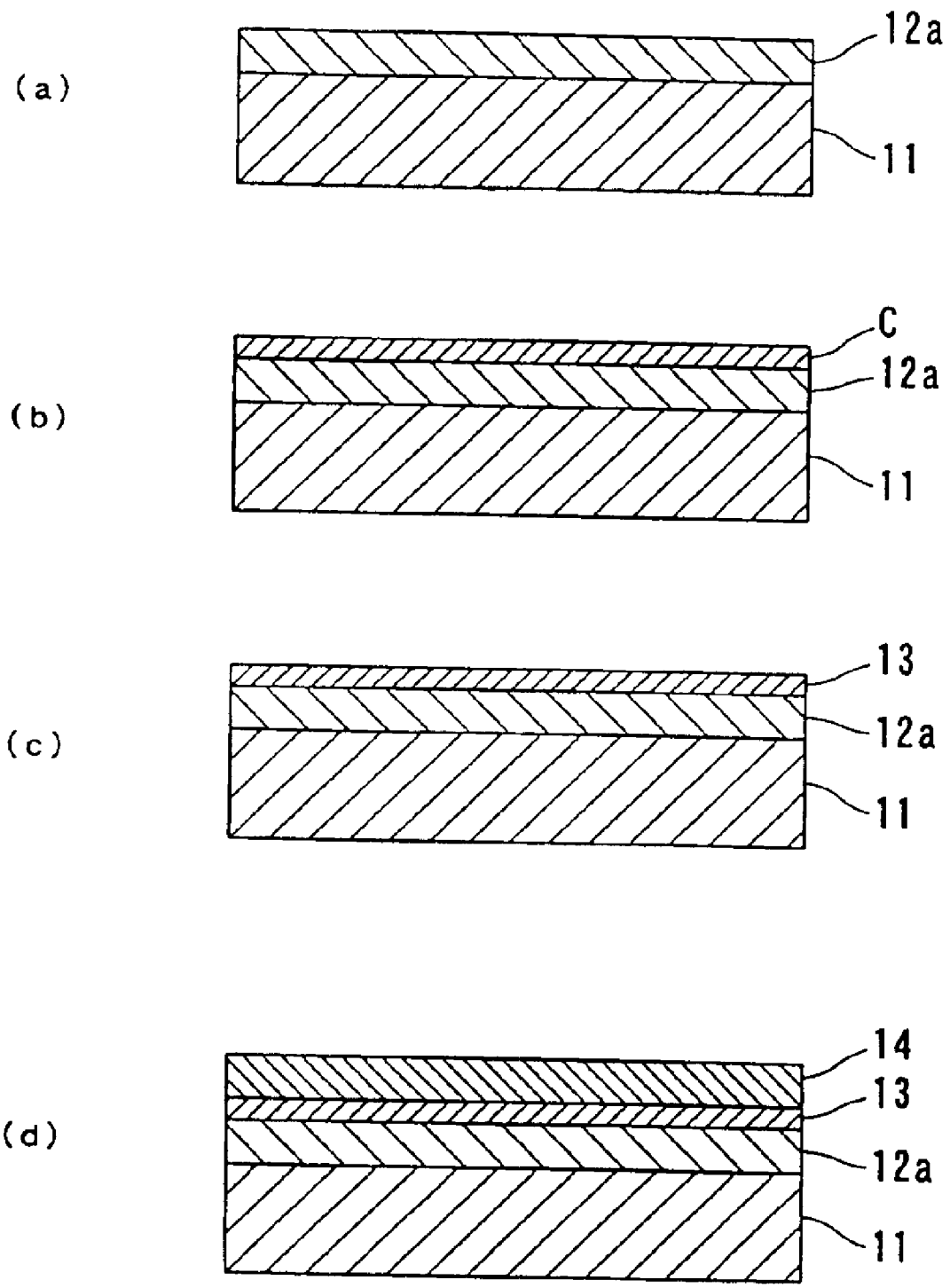
FIG. 4 is a process drawing showing another example of a method for producing a magnetoresistive device of the present invention.
Figure 5:
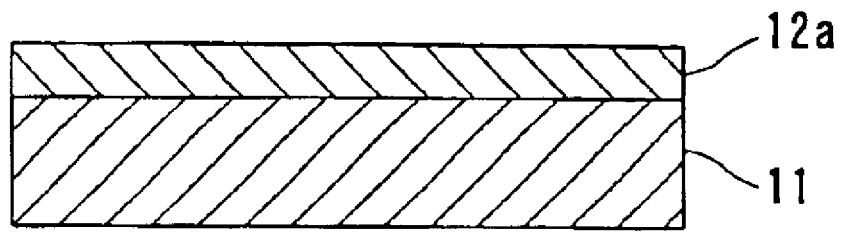
FIG. 5 is a process drawing showing still another example of a method for producing a magnetoresistive device of the present invention.
Figure 5:
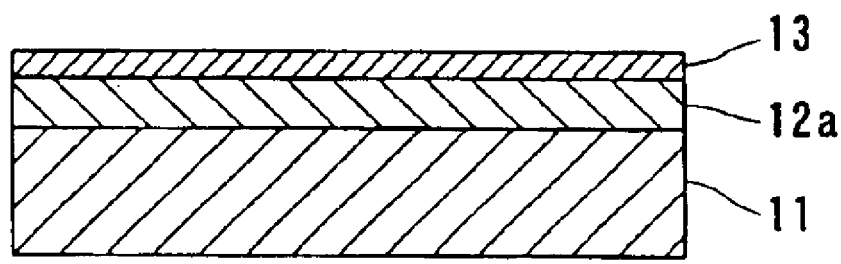
Figure 5:
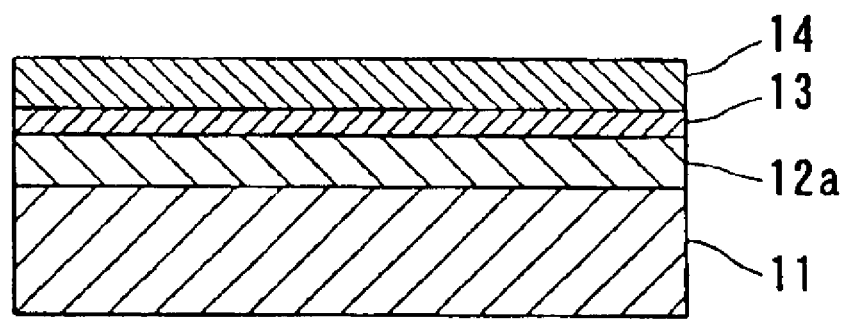

In Example 2, the magnetoresistive device 10 of the present invention was produced by the method shown in FIG. 4.

In Example 2, four devices having cross-sectional areas of 20×20, 50×50, 100×100, and 200×200 ($\mu$m×$\mu$m) were produced. The magnetic layers and the layer B were formed by RF magnetron sputtering using a metal mask. The degree of vacuum in the sputter equipment when forming a film was $6.65 \times 10^{-4}$ Pa ($5 \times 10^{-6}$ Torr). The film-forming rate for each layer was about 10 nm/min.

In Example 2, as the substrate, a Si substrate on which a $SiO_2$ film (300 nm in thickness) was formed by thermal oxidation was used.

(1) A metal mask was placed on the Si substrate, and a FeSiAl layer consisting of Fe (85 mass %)—Si (10 mass %)—Al (5 mass %) (20 nm in thickness) was formed as the first magnetic layer 12a. Then, the sputter equipment was opened in the air, and the metal mask was exchanged.

(2) On the FeSiAl layer, an aluminum layer (1.0 nm in thickness) was formed as the layer C.

(3) The substrate on which the aluminum layer was formed was allowed to stand at a substrate temperature of 60° C. in a pure oxygen atmosphere for 24 hours to oxidize the aluminum layer so that a high-resistivity layer was formed. Then, the sputter equipment was opened in the air, and the metal mask was exchanged.

(4) On the high-resistivity layer, a layer consisting of $Fe_{50}Co_{50}$ (20 nm in thickness) was formed as the second magnetic layer 14.

In Example 2, as a comparative example, a magnetoresistive device using a layer consisting of Fe (20 nm in thickness) in place of the FeSiAl layer as the magnetic layer 32 also was produced. The thus obtained magnetoresistive device was measured for MR (applied magnetic field: ±79, 600 A/m (±1000 Oe)).

With respect to both the devices using the FeSiAl alloy as the magnetic layer 32 and the device using Fe as the magnetic layer 32, it was found that the obtained MR curve was a differential coercive force type corresponding to hysteresis loops of VSM. In the device using Fe for the magnetic layer 32, the MR ratio at ±79,600 A/m (±1000 Oe) and at zero magnetic field was about 7% in any cross-sectional area of the device. On the other hand, in the device using the FeSiAl alloy for the magnetic layer 32, the MR ratio was about 20%, which was a high value. Furthermore, in the device using the FeSiAl alloy, the normalized resistance was about 2 M$\Omega$ in any cross-sectional area of the device, and a relatively low resistance was exhibited.

Auger depth profiles of respective devices were observed. As a result, it was found that in the device using Fe for the magnetic layer 32, oxygen was spread broadly from the interface between the aluminum oxide as a high-resistivity layer and the first magnetic layer (mainly Fe) to the side of the first magnetic layer. On the other hand, in the device using FeSiAl for the magnetic layer 32, Al and Si having concentration gradients were observed in high concentrations in the vicinity of the interface between the aluminum oxide and the first magnetic layer. Also, a high concentration of oxygen was observed at the same depth as where Si or Al was distributed in a high concentration. In a deeper place, it was observed that the amount of oxygen decreased more sharply than in the comparative example.

Furthermore, in the comparative example using Fe, when investigating the oxidation condition by XPS, Fe oxides were observed. On the other hand, in the magnetoresistive device using FeSiAl, only Si oxides and Al oxides were observed.

These results show that at the interface between FeSiAl as the magnetic layer and the aluminum oxide as the high-resistivity layer, diffusion of oxygen into the magnetic layer was inhibited by Si and Al, so that the oxidation of the metal element M that seems to result in spin inversion was inhibited. Thus, it appears that a very high MR can be realized by using a magnetic layer containing the element $R_{CP}$ such as FeSiAl, even though the polarizability of FeSiAl is lower than that of Fe.

As mentioned above, according to the present invention, a magnetoresistive device having a low resistance and a high MR is realized. Furthermore, the magnetoresistive device produced by the above method was so excellent that the irregularity in the device properties was about 10% in an average of ten samples.

In Example 2, although FeSiAl was used for the first magnetic layer, the same effect is obtained using other elements as long as the metal element M and the element $R_{CP}$ are contained in the first magnetic layer.

Example 3

In Example 3, a device was formed using a thin-film formation with magnetron sputtering and pattern processing with photolithography and ion milling.

In Example 3, six magnetoresistive devices with different structures were formed. The structures of the devices formed in Example 3 are shown in Tables 1 and 2.

TABLE 1

| Sample No. | Thickness of $SiO_2$ in the substrate [nm] | Thickness of the first magnetic layer [nm] | Thickness of Al layer [nm] | Oxidation conditions | | |
|---|---|---|---|---|---|---|
| | | | | Oxygen pressure [Pa] | Time [min] | Substrate temperature |
| X1 | 300 | 25 | 0.8 | 34580 | 20 | Room temp. |
| X2 | 300 | 25 | 0.8 | 34580 | 60 | Room temp. |
| X3 | 300 | 20 | 1.0 | 34580 | 60 | Room temp. |
| X4 | 500 | 20 | 0.6 | 34580 | 60 | Room temp. |
| X5 | 500 | 20 | 1.0 | 34580 | 60 | 90° C. |
| X6 | 500 | 20 | 0.8 | 34580 | 60 | 90° C. |

TABLE 2

| Sample No. | Second magnetic layer | | Thickness of interlayer insulating film [nm] | Structure of the upper electrode | | |
|---|---|---|---|---|---|---|
| | Composition [atomic %] | Thickness [nm] | | | | |
| X1 | $Co_{50}Fe_{50}$ | 11 | 200 | Au: 20 nm | Al: 200 nm | Au: 50 nm |
| X2 | $Co_{50}Fe_{50}$ | 11 | 200 | Au: 20 nm | Al: 200 nm | Au: 50 nm |
| X3 | $Co_{50}Fe_{50}$ | 4 | 200 | Pt: 10 nm | Cu: 200 nm | Ta: 50 nm |
| X4 | $Co_{90}Fe_{10}$ | 10 | 300 | Pt: 5 nm | Cu: 400 nm | Ta: 50 nm |
| X5 | $Co_{30}Fe_{70}$ | 10 | 300 | Pt: 5 nm | Cu: 400 nm | Pt: 50 nm |
| X6 | $Co_{30}Fe_{70}$ | 10 | 300 | Pt: 5 nm | Cu: 400 nm | Ta: 50 nm |

FeSiAl alloy consisting of Fe (85 mass %)—Si (10 mass %)—A (5 mass %) was used for the first magnetic layer. In the sample X6, a pinned layer (25 nm in thickness) consisting of $Ir_{20}Mn_{70}$ (atomic %) was formed between the second magnetic layer and the interlayer insulating layer.

Figure 7:
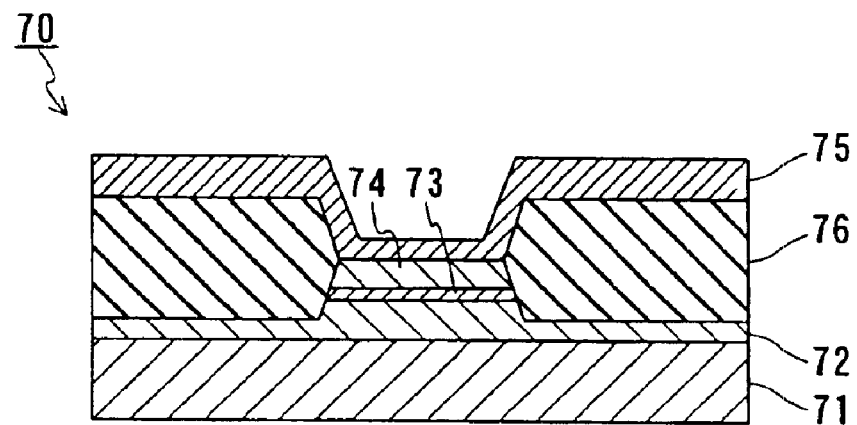
FIG. 7(a) is a partially sectional view showing still another example of a magnetoresistive device of the present invention.
FIG. 7(b) is a schematic illustration showing an arrangement of magnetic layers in the magnetoresistive device of FIG. 7(a).
Figure 7:
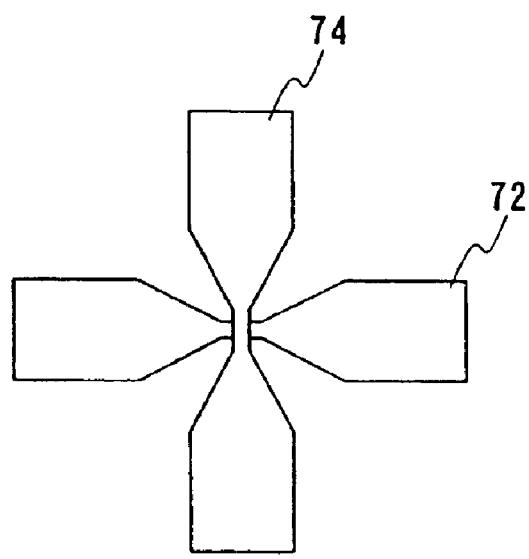

FIG. 7(a) is an enlarged view of a functional part of a magnetoresistive device 70 produced in Example 3. Referring to FIG. 7(a), the magnetoresistive device 70 includes a substrate 71; a first magnetic layer 72, a high-resistivity layer 73, a second magnetic layer 74 and an upper electrode 75 formed one by one on the substrate 71; and an interlayer insulating layer 76 located at the side faces of the high-resistivity layer 73 and the second magnetic layer 74. FIG. 7(b) is a plan view showing an arrangement of the first magnetic layer 72 and the second magnetic layer 74.

Figure 8:
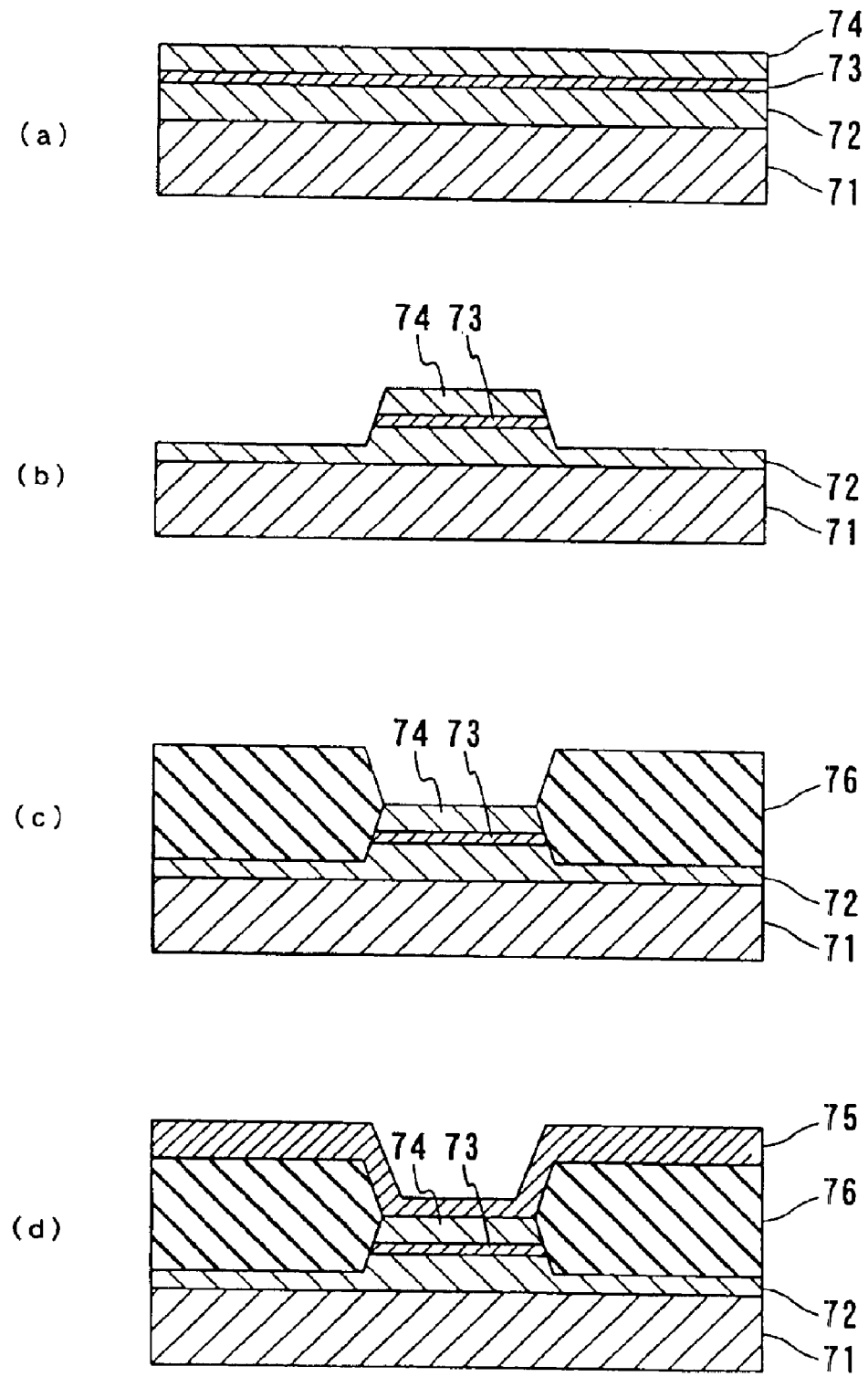
FIG. 8 is a process drawing showing a method for producing the magnetoresistive device of FIG. 7.

FIG. 8 shows a production process for the method of Example 3. In the method of Example 3, magnetron sputtering was used for forming thin films. The degree of vacuum in the sputter equipment when forming thin films was not higher than about $4 \times 10^{-4}$ Pa ($3 \times 10^{-6}$ Torr). The film-forming rate was about 0.1 to 0.2 nm/sec.

First, on the substrate 71, the first magnetic layer 72 and an aluminum layer consisting of Al were formed one by one. As the substrate 71, a Si substrate on which $SiO_2$ was formed was used. Then, oxygen was introduced in the sputter equipment to oxidize the aluminum layer, and the high-resistivity layer 73 was formed. Then, as illustrated in FIG. 8(a), the second magnetic layer 74 was formed on the high-resistivity layer 73.

Next, as illustrated in FIG. 8(b), by leaving a resist in the shape of a junction by photolithography and thereafter milling portions other than the junction, a portion of the first magnetic layer 72 was removed over the high-resistivity layer 73.

Then, as illustrated in FIG. 8(c), an interlayer insulating layer 76 consisting of $SiO_2$ was formed by lift-off technology, and side faces of the junction were insulated.

Then, as illustrated in FIG. 8(d), after cleaning the surface of the junction as needed, the upper electrode 75 was formed. The upper electrode 75 also may be formed between the steps of FIG. 8(b) and FIG. 8(c).

In FIG. 8, a magnetoresistive device in which the first magnetic layer 72 functions as a lower electrode has been described. However, the same result was obtained when further a lower electrode was formed below the first magnetic layer. In this case, the same effect was obtained even when a portion of the lower electrode was removed over the first magnetic layer by the milling in the step of FIG. 8(b).

Figure 9:
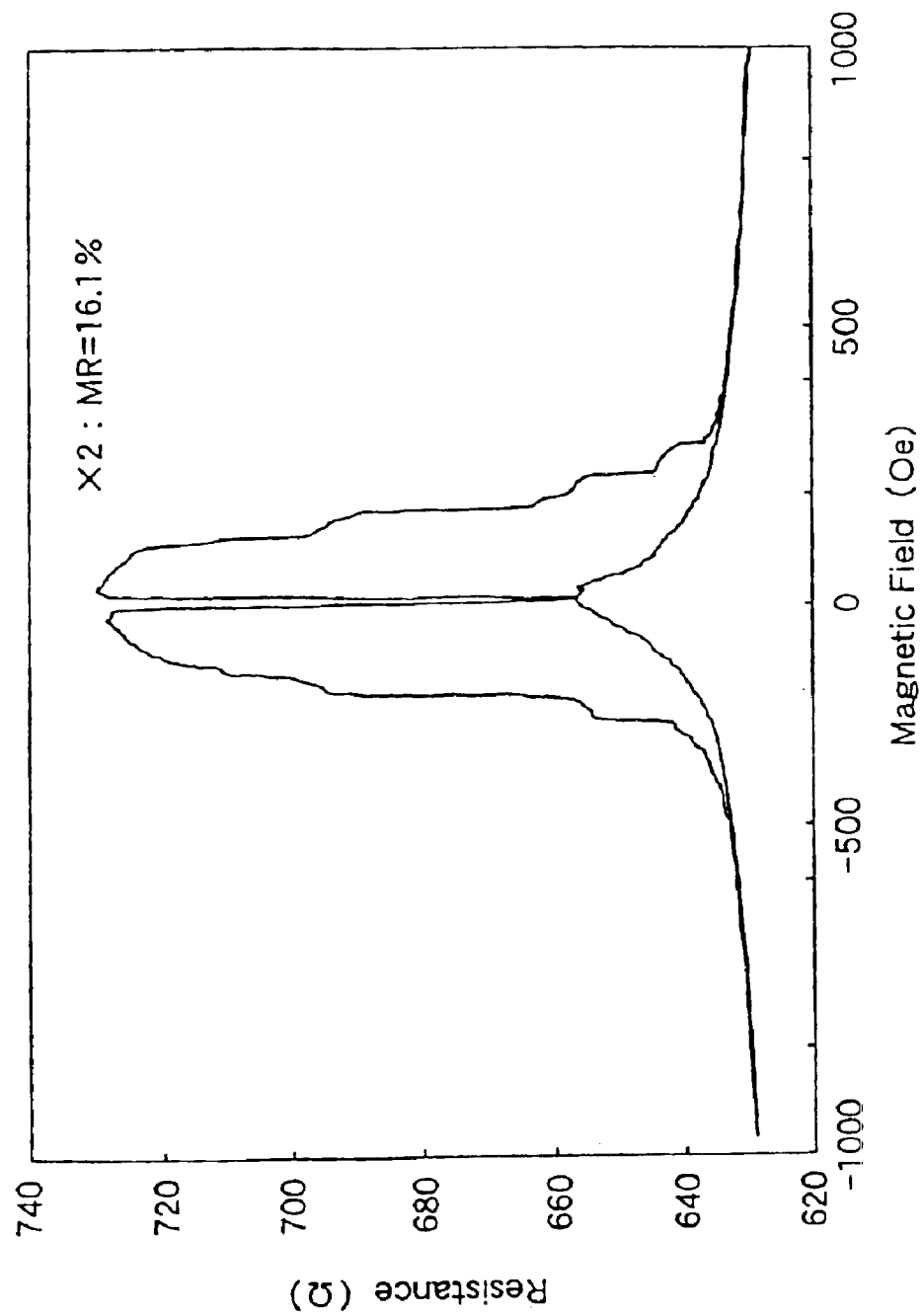
FIG. 9 is a graph showing a MR curve for a magnetoresistive device of the present invention.
Figure 10:
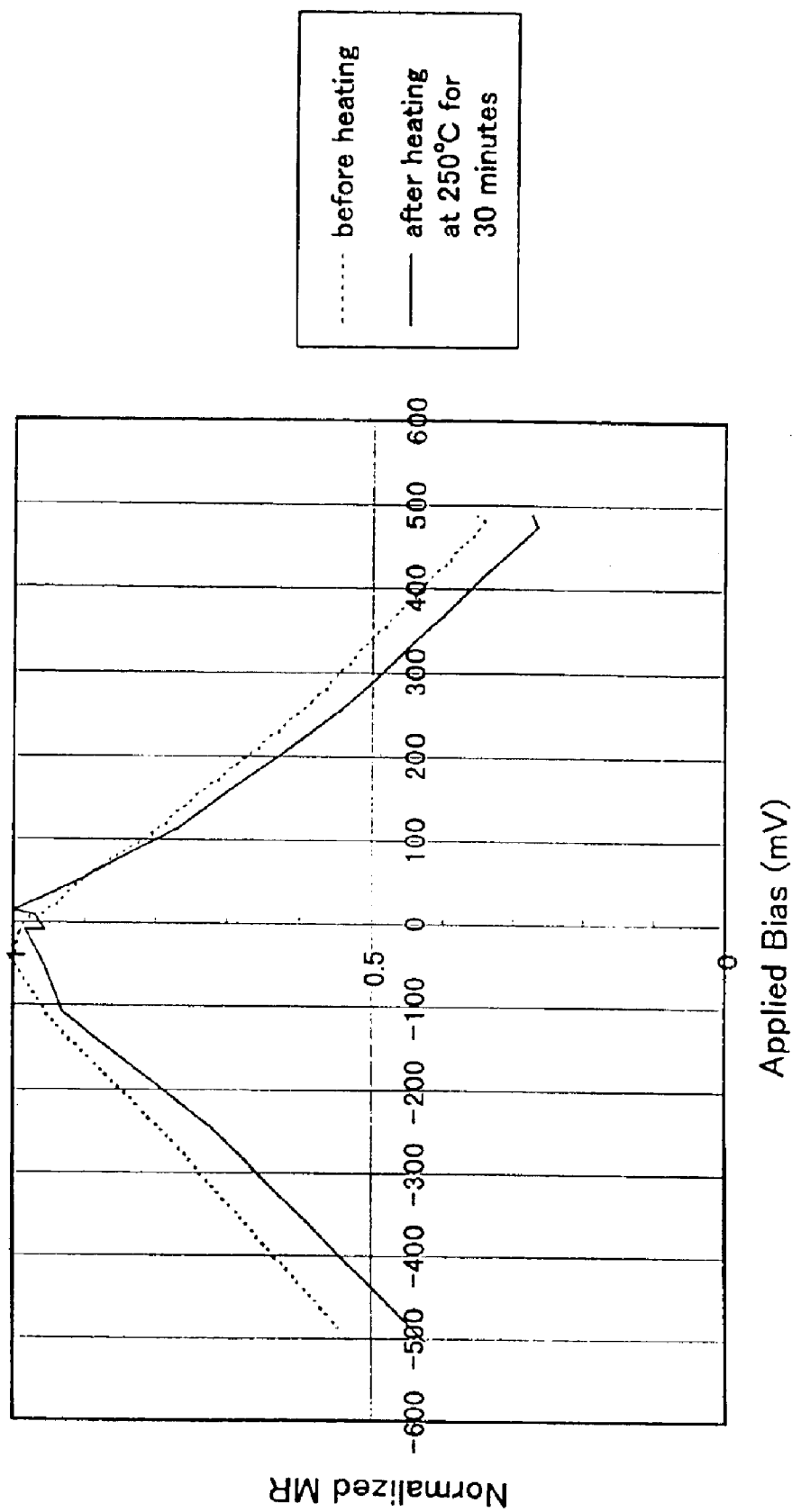
FIG. 10 is a graph showing an example of the applied bias dependency of normalized MR for a magnetoresistive device of the present invention.
Figure 11:
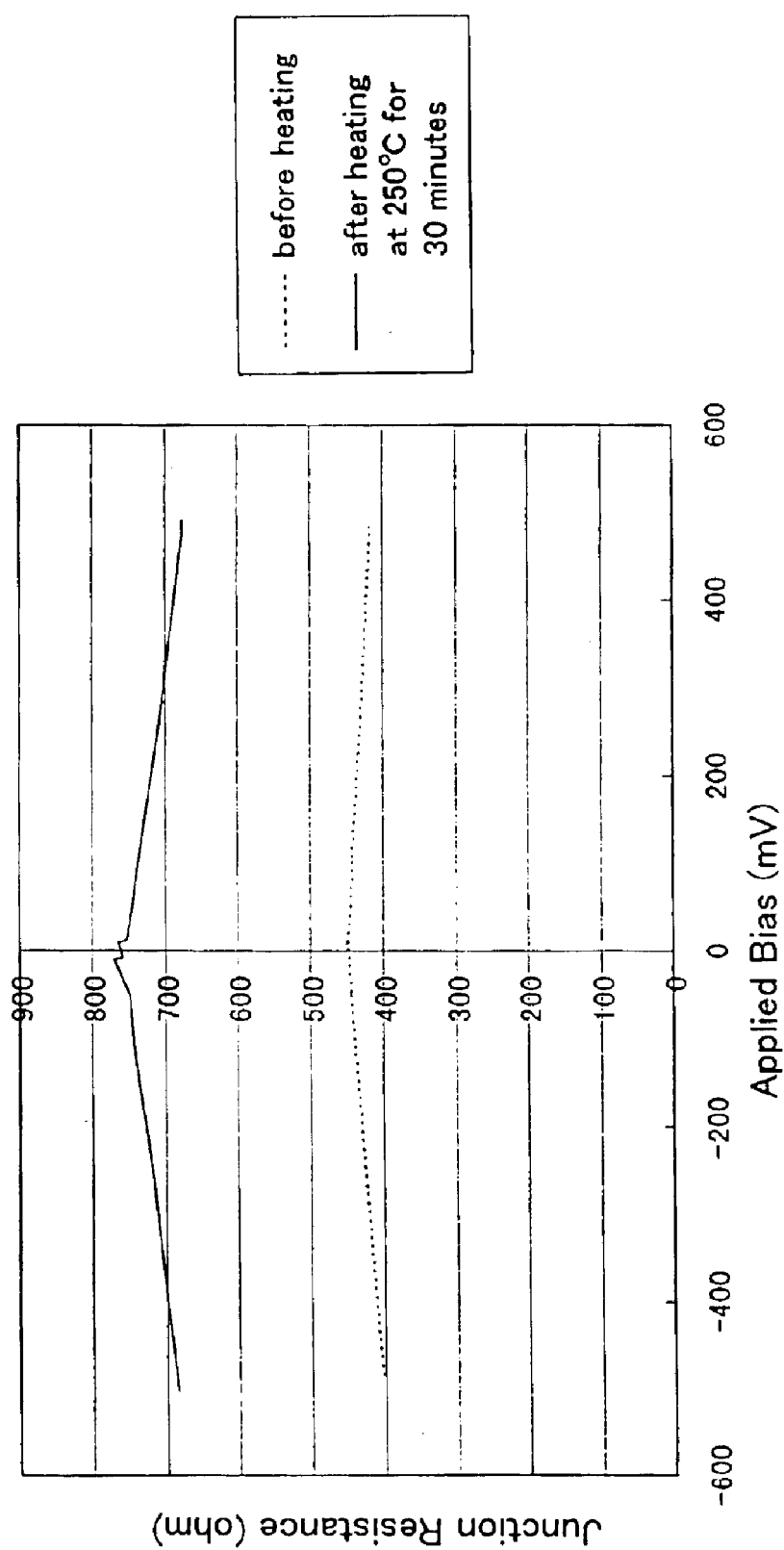
FIG. 11 is a graph showing an example of the applied bias dependency of the junction resistance for a magnetoresistive device of the present invention.
Figure 12:
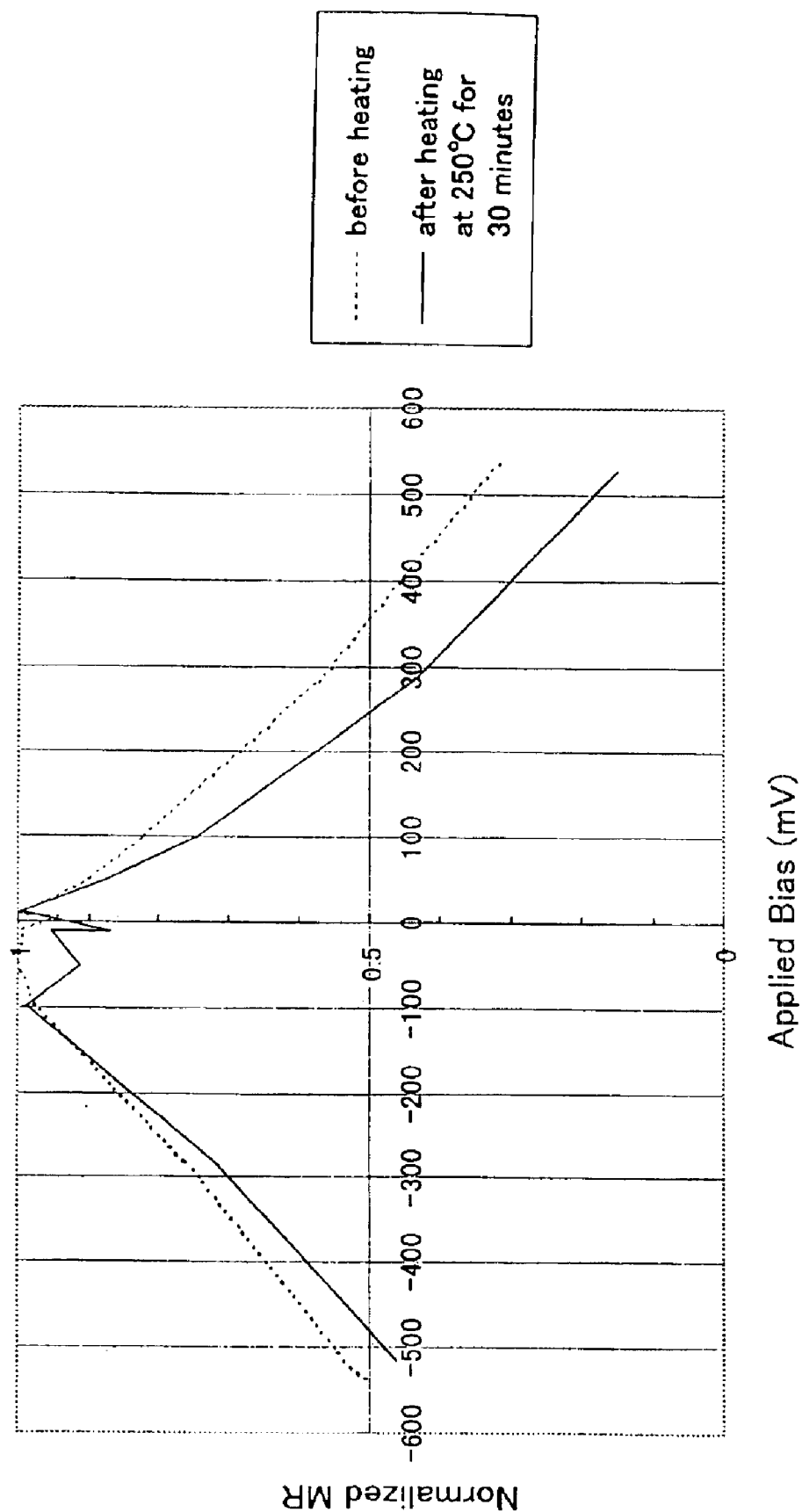
FIG. 12 is a graph showing another example of the applied bias dependency of normalized MR for a magnetoresistive device of the present invention.
Figure 13:
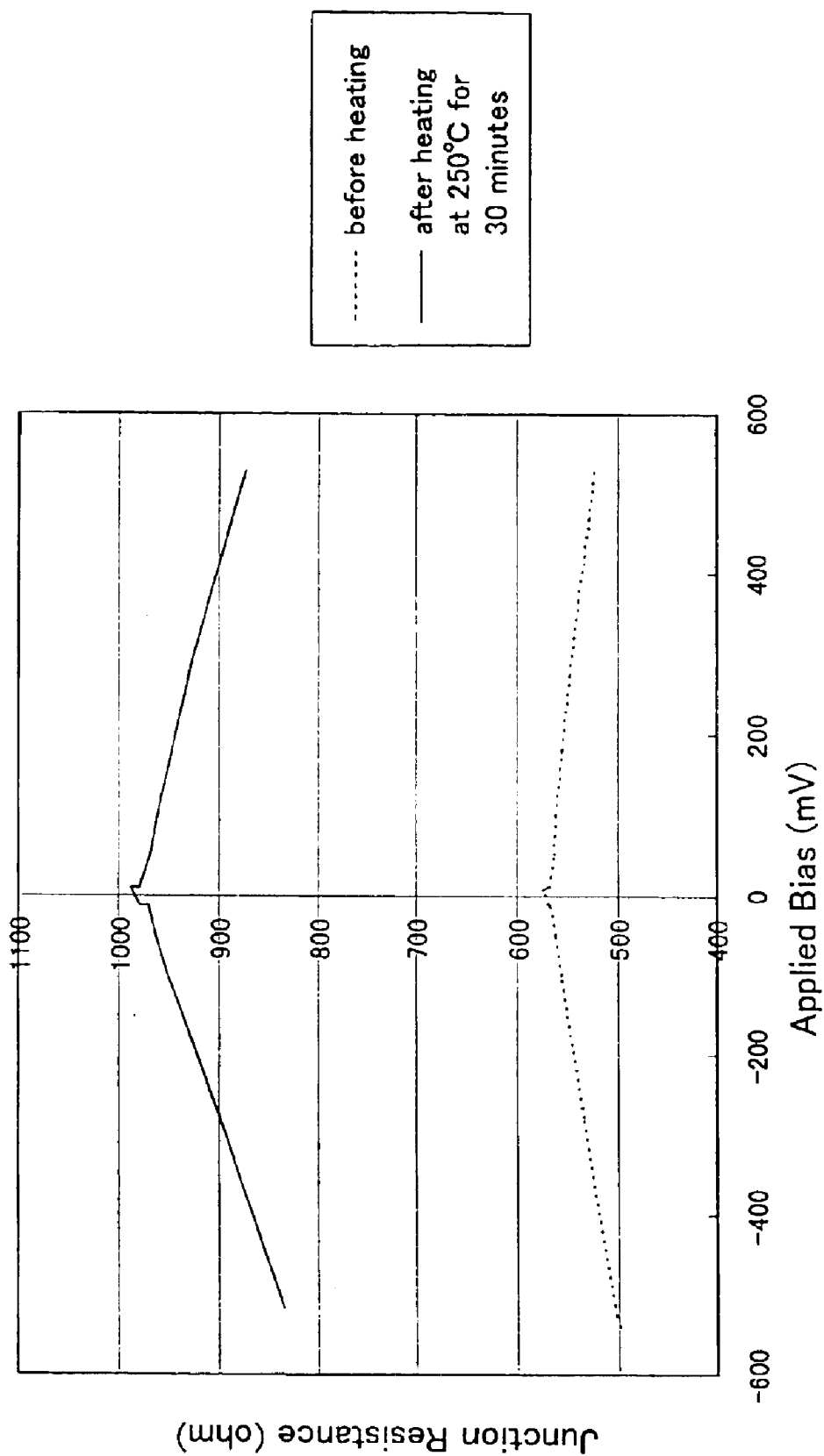
FIG. 13 is a graph showing another example of the applied bias dependency of junction resistance for a magnetoresistive device of the present invention.

With respect to the magnetoresistive device produced by the above method, a MR curve of the sample X2, which is a typical MR curve, is shown in FIG. 9. Furthermore, with respect to the device of the sample X1 before and after the heating, the applied bias dependency of MR is shown in the graph of FIG. 10, and the applied bias dependency of junction resistance is shown in the graph of FIG. 11. Furthermore, with respect to the sample X2 before and after the heating, the applied bias dependency of MR is shown in the graph of FIG. 12, and the applied bias dependency of junction resistance is shown in the graph of FIG. 13. The heating was carried out after forming the multi-layered film, or after processing it into the shape of a device. When the heating is carried out right after forming the multi-layered film, it is preferable that the heating is performed in a vacuum under a magnetic field of at least 79,600 A/m (1000 Oe). Furthermore, when the heating is carried out after processing it into the shape of a device, taking into account the influence of an anti-magnetic field, it is preferable that the heating is performed in vacuum under a magnetic field of at least 398,000 A/m (5000 Oe). The graphs shown in FIGS. 10 to 13 are for devices having a cross-sectional area of 3 μm×3 μm. Furthermore, in the graphs of FIGS. 10 to 13, the applied bias when passing a current from the second magnetic layer to the first magnetic layer (i.e. when passing electrons from the first magnetic layer to the second magnetic layer) is determined negative. In the junction resistance, different from conventional devices, only a little asymmetry was observed, but no shift of the peak value was observed. However, in the MR value, a shift of the peak MR value in the direction of negative bias was observed, and an inhibition of decrease in MR at negative bias was observed. As a result, an excellent characteristic was obtained such that the bias at which MR was decreased by half exceeded 500 mV. The same results were obtained in any of the samples X1 to X6 in Tables 1 and 2. With respect to the samples X1 to X6, the bias at which MR was decreased by half when a bias was applied from the first magnetic layer to the second magnetic layer is shown in Table 3.

TABLE 3

| Sample No. | Peak MR value (%) | Bias at which MR is Decreased by half [mV] |
| --- | --- | --- |
| X1 | 11.8 | 510 |
| X2 | 16.2 | 550 |
| X3 | 7.8 | 510 |
| X4 | 10.9 | 650 |
| X5 | 13.5 | 570 |
| X6 | 6.0 | 500 |

When a magnetic layer having at least one element selected from Fe, Co and Ni as a basic component and having at least 0.5 mass % of at least one element selected from Al, Si, Ge, Ga, Cr, V, Nb, Ta, Ti, Zr, Hf, Mg and Ca as an additional component was used as the first magnetic layer, the same effect was obtained. Furthermore, when a layer consisting of at least one element selected from Si, Ge, Ga, Cr, V, Nb, Ta, Ti, Zr, Hf, Mg and Ca was used in place of the aluminum layer that becomes the high-resistivity layer 73, the same effect was obtained.

Example 4

Figure 6:
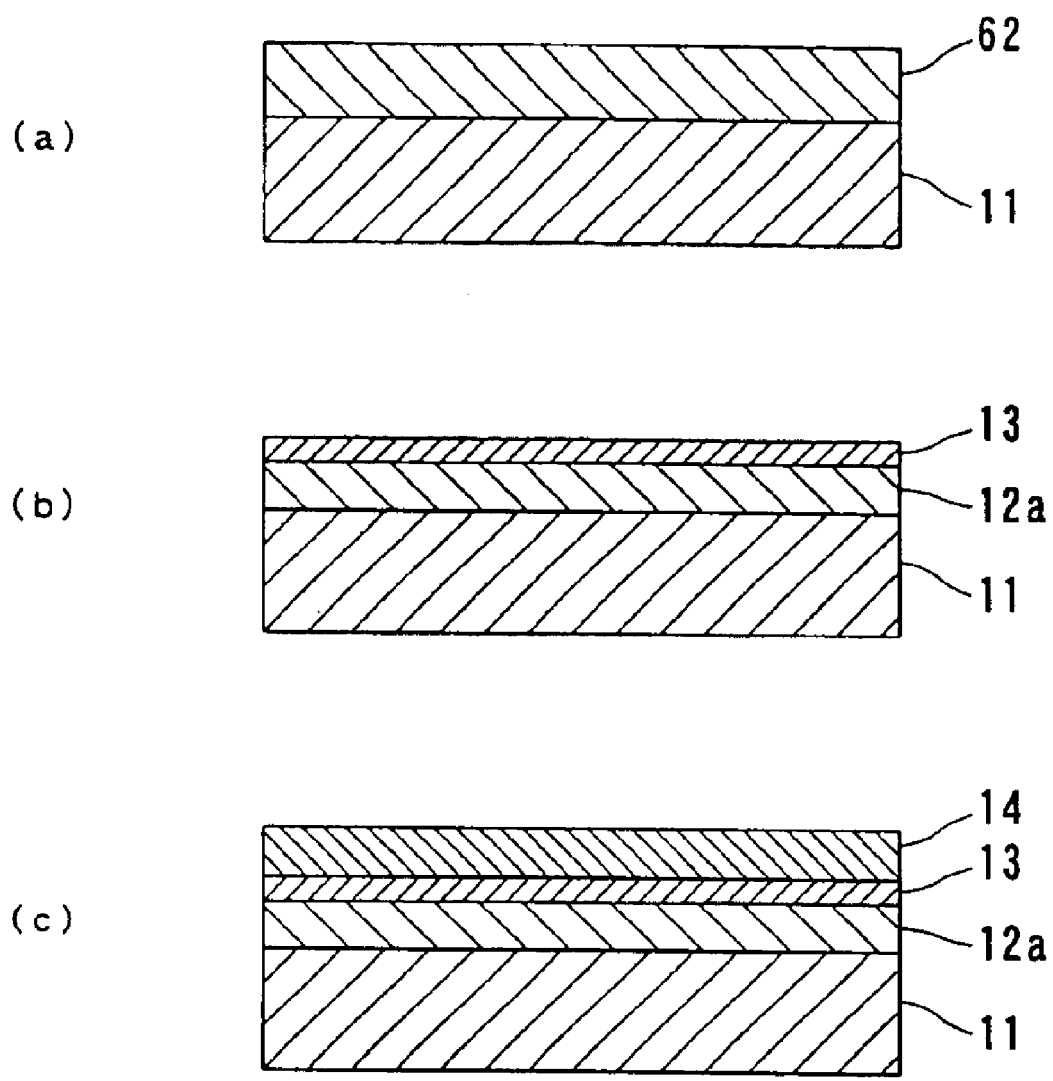
FIG. 6 is a process drawing showing still another example of a method for producing a magnetoresistive device of the present invention.

In Example 4, a magnetoresistive device of the present invention was produced by the method illustrated in FIG. 6.

In Example 4, four devices having cross-sectional areas of 20×20, 50×50, 100×100, and 200×200 (μm×μm) were produced. Each layer was formed by RF magnetron sputtering. The degree of vacuum in the sputter equipment when forming a film was $6.65 \times 10^{-4}$ Pa ($5 \times 10^{-6}$ Torr). The film-forming rate for each layer was about 10 nm/min.

In Example 4, as the substrate, a Si substrate on which a $SiO_2$ film (300 nm in thickness) was formed by thermal oxidation was used.

(1) A metal mask was placed on the Si substrate, and a FeSiAl layer consisting of Fe (85 mass %)—Si (10 mass %)—Al (5 mass %) was formed as the magnetic layer 62. The substrate temperature when forming the layer was 450° C. The thickness of the FeSiAl layer was 20 nm.

(2) Pure oxygen of 13.3 Pa (100 mTorr) was introduced into the sputter equipment. Then, the substrate was allowed to stand in the pure oxygen atmosphere for 0.5 hour while maintaining the substrate temperature at 450° C. Thus, the surface of the FeSiAl layer was oxidized, and a high-resistivity layer was formed. Then, the sputter equipment was opened in the air, and the metal mask was exchanged.

(3) As the second magnetic layer, a NiFe layer (20 nm in thickness) consisting of $Ni_{80}Fe_{20}$ was formed at room temperature. Thus, a magnetoresistive device of the present invention was formed. For the thus obtained device, MR was measured (applied magnetic field: ±79,600 A/m (±1000 Oe)).

It was found that the MR curve measured after the step (3) was a differential coercive force type corresponding to the hysteresis loop of FeSiAl and the hysteresis loop of NiFe. The MR ratio in the device was from 27 to 30%, which was very high. Furthermore, the resistance of the device was 30 kΩ, which was very low.

Figure 14:
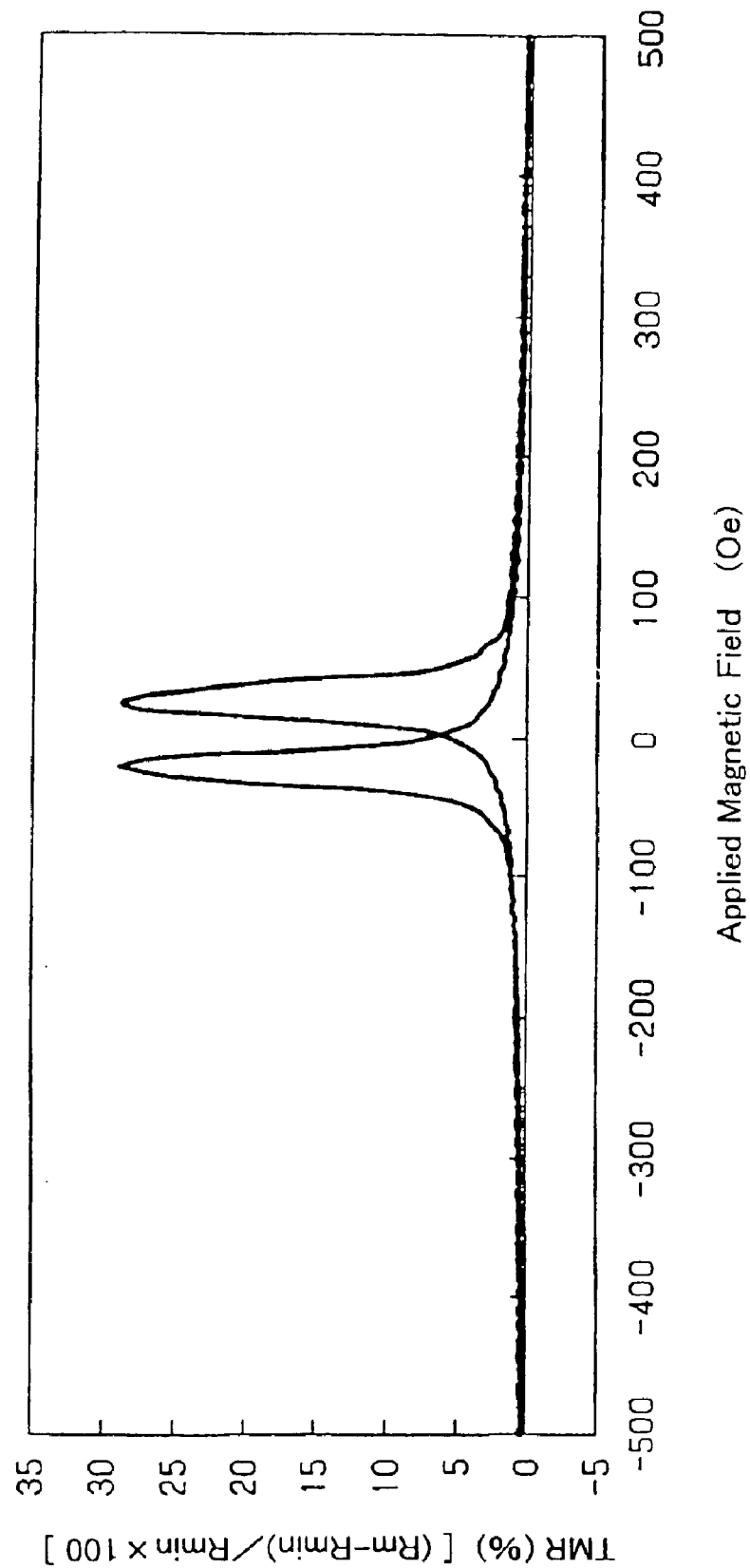
FIG. 14 is a graph showing another example of a MR curve for a magnetoresistive device of the present invention.

FIG. 14 shows an example of the MR curve of the device. Both the rise and fall of the MR curve are gentle. Although from the MR curves of respective magnetic films it appears that magnetized FeSiAl and NiFe are not completely antiparallel, it is understood that a very high MR is realized. Furthermore, although both FeSiAl and NiFe have lower spin polarizability than Fe or FeCo, a higher MR and a lower resistance than Example 1 or 2 were obtained.

When observing an Auger depth profile of the device, an oxide layer of the FeSiAl layer (the first magnetic layer) having particularly high concentrations of Si and Al was observed at the interface between the FeSiAl layer and the NiFe layer. Furthermore, the oxygen concentration changed sharply in this layer. Taking into consideration the change in the composition ratio of Si and Al, it seems that particularly aluminum diffused from inside of the FeSiAl layer into the high-resistivity layer.

These results show that a high-resistivity layer can be formed by natural oxidation (or thermal oxidation) of a magnetic layer containing the element $R_{CP}$ (such as FeSiAl), and a TMR device having an excellent MR and a low resistance can be obtained.

Although FeSiAl was used for the first magnetic layer in Example 4, the same effect is obtained as long as the first magnetic layer contains at least one metal element M selected from Fe, Co and Ni, and at least one element $R_{CP}$ selected from Si, Ge, Al, Ga, Cr, V, Nb, Ta, Ti, Zr, Hf, Mg and Ca (This also applies to the following examples).

Furthermore, in Example 4, the FeSiAl layer was formed while heating the substrate. However, the FeSiAl layer also may be oxidized, nitrided, or carbonized by heating the substrate at a temperature of at least 50° C. but not higher than 800° C. after forming the FeSiAl layer at room temperature. The oxidation or nitriding may be carried out by treating it in an oxygen atmosphere, oxygen plasma atmosphere, nitrogen atmosphere, or nitrogen plasma atmosphere, while heating the substrate. The gas pressure at this time is, for example, from 13.3 mPa (0.1 m Torr) to $1.11 \times 10^5$ Pa (1 atm.). In this method, a tunnel junction also can be formed in the same way as in Example 4 (This also applies to the following examples.).

Example 5

In Example 5, a magnetoresistive device of the present invention was produced by the method described in the second embodiment. In Example 5, each layer was formed by the same film-forming method as in Example 1. The same Si substrate as in Example 1 was used. The device of Example 5 had a cross-sectional area of 100 μm×100 μm.

(1) A metal mask was placed on the Si substrate, and a FeSiAl layer consisting of Fe (85 mass %)—Si (10 mass %)—Al (5 mass %) was formed as the first magnetic layer 12a. The substrate temperature when forming the layer was 430° C. The thickness of the FeSiAl layer was 20 nm.

(2) Pure oxygen of 13.3 Pa (100 mTorr) was introduced into the sputter equipment. Then, the substrate was allowed to stand in the pure oxygen atmosphere for 1 hour while maintaining the substrate temperature at 430° C. Thus, the surface of the FeSiAl layer was oxidized, and a high-resistivity layer was formed. Then, the sputter equipment was opened in the air, and the metal mask was exchanged.

(3) As the second magnetic layer, a CoFe layer (11 nm in thickness) consisting of $Co_{50}Fe_{50}$ was formed at room temperature. For the thus obtained magnetoresistive device, MR was measured (applied magnetic field: ±79,600 A/m (±1000 Oe)).

It was found that the MR curve measured when completing the step (3) was a differential coercive force type corresponding to a hysteresis loop of FeSiAl and a hysteresis loop of CoFe. After the step (3), because the junction resistance of 100 square micron was not sufficiently high with respect to the sheet of FeSiAl serving as an electrode, the MR curve included a shape effect. When this device was heated at 250° C., the junction resistance increased, and a normal tunnel magnetic resistance was able to be measured. The MR after the heating was about 20%, which was very high.

Figure 15:
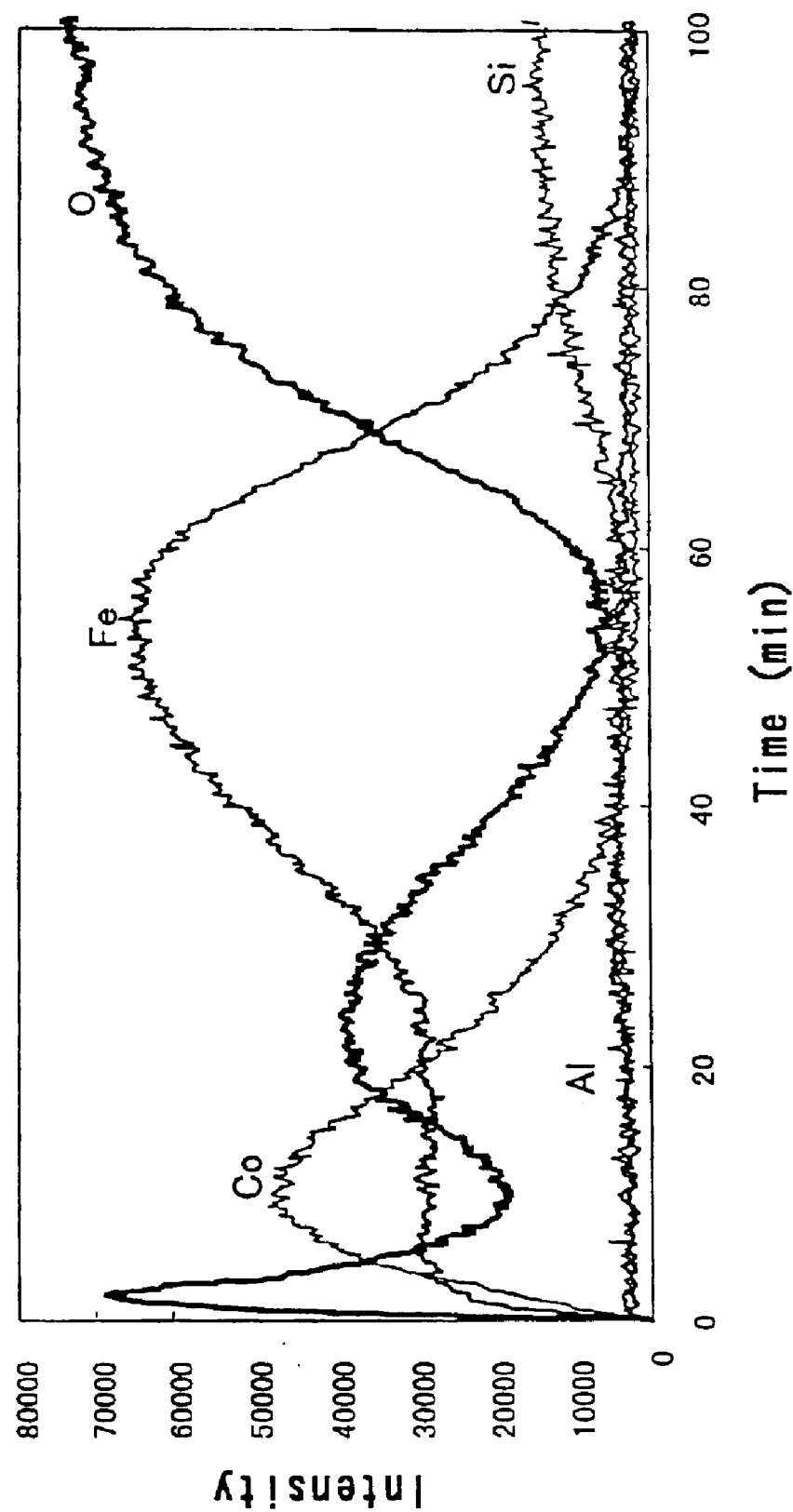
FIG. 15 is a graph showing an Auger depth profile of a junction for a magnetoresistive device of the present invention.
Figure 16:
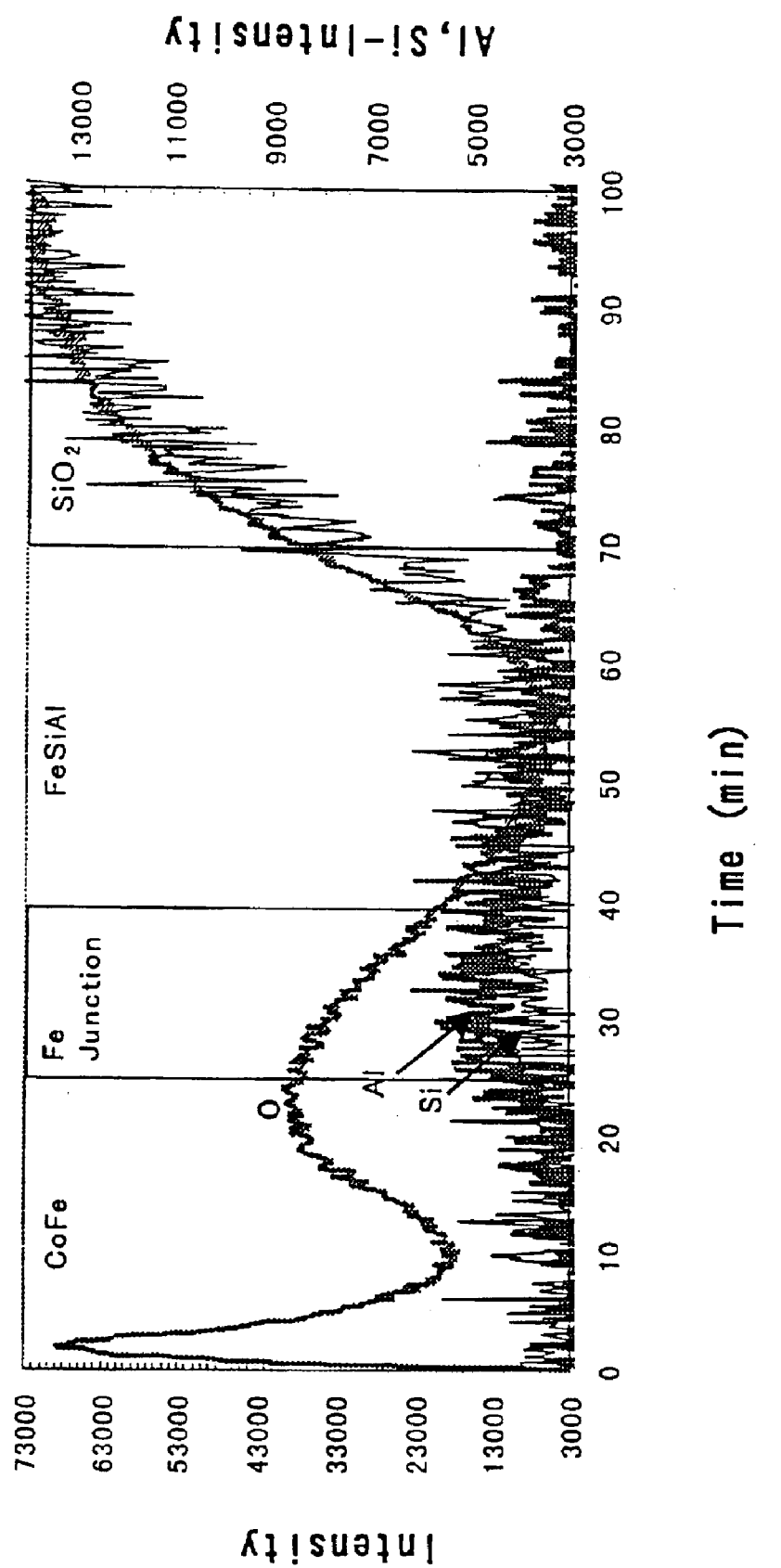
FIG. 16 is a magnification of the graph shown in FIG. 15.

An Auger depth profile after the heating is shown in FIG. 15. A magnification of the longitudinal axis of FIG. 15 is shown in FIG. 16. As illustrated, CeFe is oxidized since the outermost surface of the sample is in contact with the air. However, the presence of an oxide layer at the surface of FeSiAl is confirmed toward the depth direction (i.e. the substrate direction, the right side of the graph). In FIG. 16, it is observed that particularly, the peak of the intensity distribution of aluminum is shifted slightly to the substrate side with respect to the intensity distribution of oxygen forming the high-resistivity layer, and the intensity of aluminum is decreased in the FeSiAl layer. This seems to be because aluminum has diffused mainly from inside of the FeSiAl layer.

These results show that by natural oxidation (or thermal oxidation) of a magnetic layer containing an element $R_{CP}$ such as FeSiAl, a high-resistivity layer is formed, and a TMR device having an excellent MR and a low resistance is obtained.

Example 6

In Example 6, as for the magnetoresistive device of Example 5, the bias dependency of MR property was investigated by changing the direction of an applied bias (direction of a current). The results are shown in FIG. 17.

Figure 17:
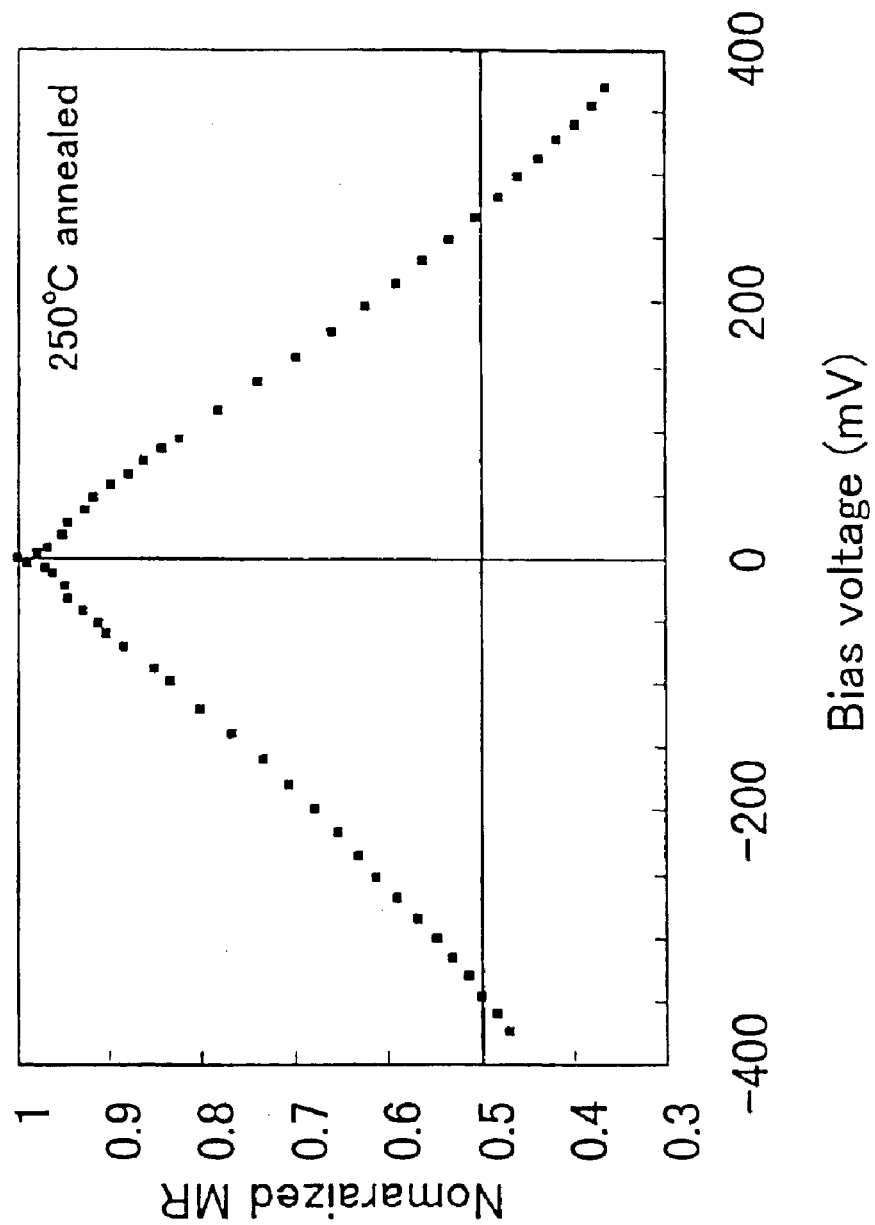
FIG. 17 is a graph showing still another example of the applied bias dependency of normalized MR for a magnetoresistive device of the present invention.

In FIG. 17, the bias is considered positive when a current is passed from FeCo to FeSiAl. Inversely, the bias is considered negative when a current is passed from FeSiAl to FeCo. The longitudinal axis of FIG. 17 shows normalized MR.

In the magnetoresistive device of Example 5, different from Example 3, higher bias stability was obtained when a current was passed from the FeSiAl layer (the first magnetic layer 12a).

Example 7

In Example 7, the heating temperature dependency of MR was investigated by further heating the magnetoresistive device of Example 5. The heating was carried out in vacuum under zero magnetic field.

Figure 18:
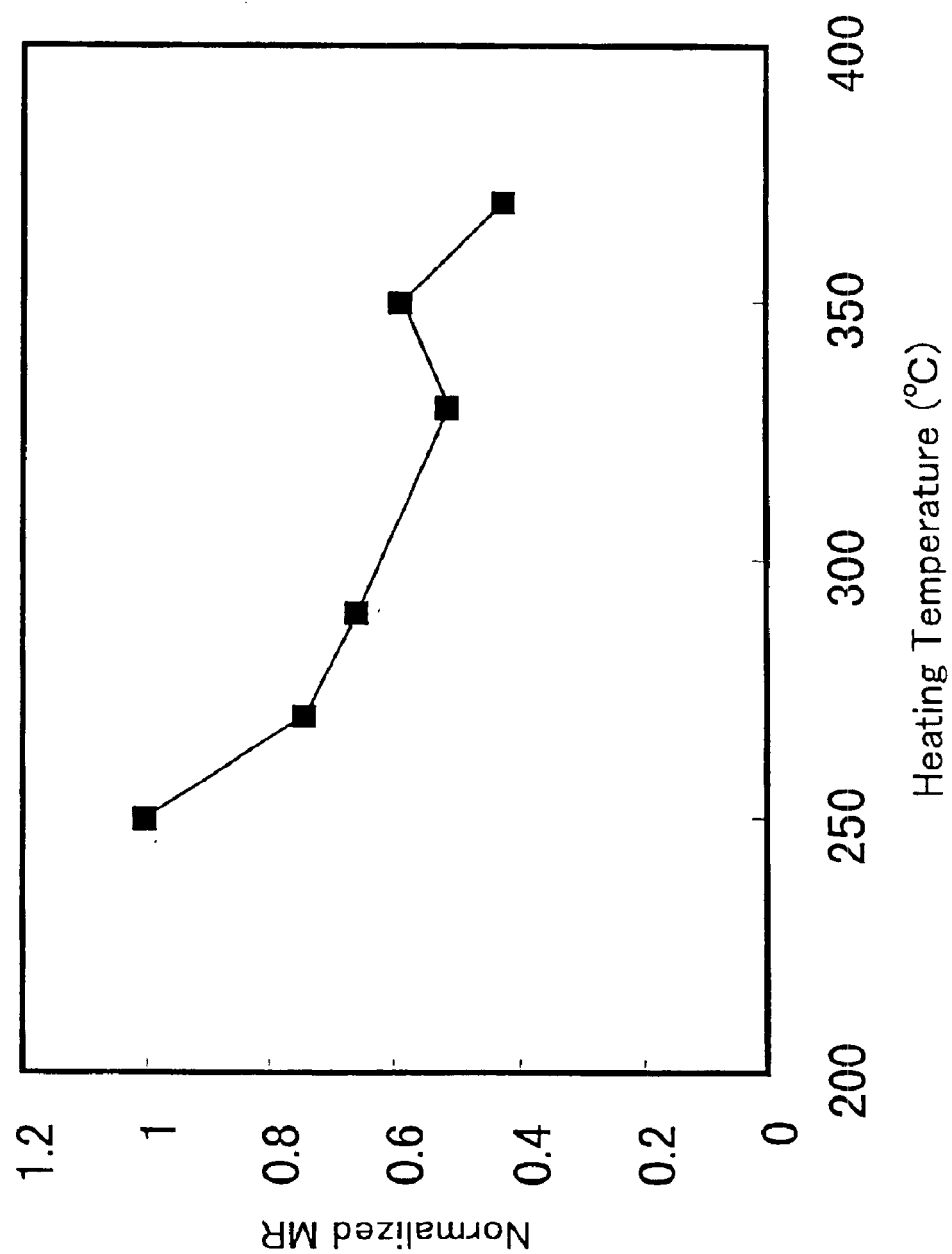
FIG. 18 is a graph showing a relation between the heating temperature and normalized MR for a method for producing a magnetoresistive device of the present invention.

The measurement results are shown in FIG. 18. The longitudinal axis of the graph shows normalized MR, and the lateral axis of the graph shows heating temperature. The MR is normalized in FIG. 18. Different from conventional TMR devices, the tunnel structure was maintained after heating it at a high temperature of 400° C. This shows that the magnetoresistive device of the present invention has high thermal stability.

The magnetoresistive device of the present invention showed a characteristic in that heating at a temperature of at least 200° C. further increases the MR ratio, or that thermal stability was maintained at a high temperature.

Having described embodiments of the present invention with reference to examples, the present invention is not limited to the above-described embodiments, and may be applied to other embodiments based on the technical idea of the present invention.

INDUSTRIAL APPLICABILITY

As mentioned above, in the magnetoresistive device of the present invention, decrease in MR due to spin inversion in the vicinity of the high-resistivity layer, and deletion of spin memory due to unreacted non-magnetic material (mainly Al) are inhibited. Thus, according to the magnetoresistive device of the present invention, a very thin high-resistivity layer can be formed. As a result, a magnetoresistive device having a low resistance and a high rate of change in magnetoresistance is obtained.

The magnetoresistive device of the present invention can be used in a wide range of applications such as reproducing heads of magnetic recorders, magnetic sensors, magnetic random access memories (MRAM) or the like. By using the magnetoresistive device of the present invention as a reproducing head for magnetic or photomagnetic recording media, a high memory density of 15.5 Gbit/cm² (100 Gbit/in²) is realized. Furthermore, by using the magnetoresistive device of the present invention, nonvolatile memories corresponding to high frequencies are realized.

Furthermore, in the method of the present invention for producing a magnetoresistive device, oxygen, nitrogen, carbon or the like diffusing from the high-resistivity layer into the first magnetic layer is captured by the element $R_{CP}$ when forming the high-resistivity layer. Thus, according to the method of the present invention, a magnetoresistive device having a low resistance and a high rate of change in magnetoresistance can be produced easily. Furthermore, according to the method of the present invention, a device with little irregularity can be produced with high productivity.

What is claimed is:

1. A method for producing a magnetoresistive device, comprising:

(a) forming a first magnetic layer located on a substrate, and a high-resistivity layer located on the first magnetic layer and comprising at least one element $L_{ONC}$ selected from oxygen, nitrogen and carbon; and (b) forming a second magnetic layer on the high-resistivity layer; wherein the first magnetic layer comprises at least one metal element M selected from Fe, Ni and Co, and an element $R_{CP}$ different from the metal element M;

the element $R_{CP}$ combines with the element $L_{ONC}$ more easily in terms of energy than the metal element M;

at least a part of the high-resistivity layer is a layer that is in surface contact with the first magnetic layer and the second magnetic layer; and the high-resistivity layer is a barrier for passing tunneling electrons between the first magnetic layer and the second magnetic layer.

2. The method according to claim 1, wherein in the step (a), the first magnetic layer is formed by evaporation or sputtering so that a concentration of the element $R_{CP}$ is high on the side of the high-resistivity layer in the first magnetic layer.

* * * * *